United States Patent
Yamada et al.

(10) Patent No.: US 6,236,447 B1
(45) Date of Patent: *May 22, 2001

(54) EXPOSURE METHOD AND APPARATUS, AND SEMICONDUCTOR DEVICE MANUFACTURED USING THE METHOD

(75) Inventors: Yuichi Yamada; Atsushi Kawahara, both of Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/141,141

(22) Filed: Aug. 27, 1998

(30) Foreign Application Priority Data

Aug. 29, 1997 (JP) .................................................. 9-247500

(51) Int. Cl.⁷ .............................. G03B 27/42; G03B 27/52
(52) U.S. Cl. ................................................ 355/53; 355/55
(58) Field of Search ................................ 355/30, 53, 67, 355/77, 50, 51, 52, 55; 250/548; 356/399, 401

(56) References Cited

U.S. PATENT DOCUMENTS

| | | | |
|---|---|---|---|
| 4,655,599 | 4/1987 | Ayata et al. ............................ | 356/401 |
| 4,962,423 | 10/1990 | Yamada et al. ....................... | 358/101 |
| 5,015,866 | * 5/1991 | Hayashi ................................ | 250/548 |
| 5,137,349 | * 8/1992 | Taniguchi et al. ................... | 353/122 |
| 5,286,963 | * 2/1994 | Torigoe ............................. | 250/201.2 |
| 5,323,016 | 6/1994 | Yamada et al. ....................... | 250/561 |
| 5,361,122 | * 11/1994 | Kataoka et al. ...................... | 355/53 |
| 5,448,332 | * 9/1995 | Sakakibara et al. ................... | 355/53 |
| 5,581,324 | * 12/1996 | Miyai et al. ............................ | 355/53 |
| 5,635,722 | * 6/1997 | Wakamoto et al. .................. | 250/548 |
| 5,693,439 | * 12/1997 | Tanaka et al. ......................... | 430/30 |
| 5,742,067 | * 4/1998 | Imai ..................................... | 250/548 |
| 5,751,428 | 5/1998 | Kataoka et al. ...................... | 356/401 |
| 5,781,277 | * 7/1998 | Iwamoto .............................. | 355/53 |
| 5,793,471 | 8/1998 | Kanda et al. .......................... | 355/53 |

FOREIGN PATENT DOCUMENTS

| | | |
|---|---|---|
| 4-116414 | 4/1992 | (JP) . |
| 4-50731 | 8/1992 | (JP) . |
| 6-52707 | 7/1994 | (JP) . |

* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

An exposure method for exposing a surface to be exposed via a projection optical system after a substrate moves stepwise in a direction perpendicular to an optical axis of the projection optical system to feed to a predetermined exposure position a plurality of shots on the substrate, in turn, in which at least one of a position and tilt of the surface to be exposed of a fed shot to be exposed in the direction of the optical axis is measured during the stepwise movement, and the surface to be exposed is brought to a position of a focal plane of the projection optical system on the basis of a measurement value. The method includes a step of obtaining, in advance, a focus offset as a measurement error resulting from different measurement points for the measurement during the stepwise movement and a deformation of a main body structure, in each shot, and a step of bringing the surface to be exposed for the shot to be exposed to the position of the focal plane on the basis of a correction result of the measurement, in each shot to be exposed, using the focus offset, in an exposure sequence.

28 Claims, 19 Drawing Sheets

MOVING DIRECTION OF OPTICAL AXIS →

SEMICONDUCTOR DEVICE MANUFACTURING FLOW

WAFER PROCESS

EXPOSURE METHOD AND APPARATUS, AND SEMICONDUCTOR DEVICE MANUFACTURED USING THE METHOD

BACKGROUND OF THE INVENTION

Improved productivity is strongly demanded for recent semiconductor manufacturing apparatuses, especially, step & repeat semiconductor exposure apparatuses called steppers. That is, chip manufacturers must reduce the chip price to realize a memory cost that justifies chip replacement along with the memory trend of a continual shrinkage in design geometries.

Exposure apparatus manufacturers must provide apparatuses which not only have high performance but also can improve productivity, and are required to increase the processing capability, i.e., the number of wafers to be processed per unit time in addition to basic performance such as high resolution, alignment precision, and the like. As a method of shortening the step time of a semiconductor exposure apparatus currently used in the production site, the present applicant has proposed a method of detecting the position and tilt of the substrate surface during stepping in Japanese Patent Publication No. 4-50731 and Japanese Patent Laid-Open No. 4-116414. Using this method, surface position correction can be started at an earlier timing than the conventional method of detecting the position and tilt of the substrate after it is aligned to the exposure position, thus shortening the overall step time.

In process design in the manufacture of semiconductors used to date, the exposure wavelengths of exposure apparatuses have been selected according to the interconnect rules. That is, manufacturing lines have been built to have an exposure wavelength corresponding to the minimum resolvable line width (e.g., an i-line stepper for the 0.35-$\mu$m rule, a KrF stepper for the 0.25-$\mu$m rule, and so forth), and the budget related to a depth of focus of around 1.0 $\mu$m is shared by the apparatus and process. However, there are also some trends for continued use of a KrF exposure apparatus as the exposure technique for the next-generation 0.18-$\mu$m rule, ultimately for mass-production of 1 G (giga) DRAMs complying with the 0.1-$\mu$m rule. Improved intra-chip planarity by CMP (chemical mechanical polish) has largely contributed to such trends in addition to development of micro-patterning techniques such as a phase shift mask, super-resolution, and the like. CMP reportedly reduces the chip step below around 50 nm upon lapping a trench structure: this means a lens with a high NA (Numerical Aperture) due to a remarkably decreased depth of focus compared to a conventional lens can be designed to provide resolving power below the wavelength. However, correction precision of the focus leveling must be further improved to cope with a decrease in depth of focus resulting from a high NA. That is, even when the step is as small as around 50 nm in a trench structure, a process using a stack structure may often have a step of a maximum of about 0.3 $\mu$m due to density difference. As a result, in the conventional method of detecting and correcting the position and tilt of the substrate surface during stepping, measurement offset differences arising from focus measurement position differences at the exposure still position and stepping measurement position may produce defocus as a result of a decrease in the depth of focus in the 0.18-$\mu$m generation. This state will be explained below with reference to FIG. 17. In FIG. 17, the correspondence between the measurement position and intra-chip step structure will be explained while paying attention to one of five sensors used in an embodiment to be described later. In FIG. 17, at a stepping measurement position 41, a height 42 of a portion having a step such as a memory cell portion is measured. When the measurement position reaches the exposure position, it is located at a step portion 43 between a memory cell and peripheral circuit portion and their average height 44 is measured. Conventionally, since a depth of focus of 1.0 $\mu$m is assured, an intra-chip step of around 0.3 $\mu$m is permitted in terms of budget even if it is formed after a fill process of a recess array or the like. However, in a recent situation with a decreased depth of focus in a high-NA exposure apparatus, this difference is no longer negligible. More specifically, as the depth of focus is as strict as about 0.6 $\mu$m, the difference of 0.3 $\mu$m (the difference from the measurement value at the stepping measurement point with respect to a reference position corrected for an offset of the exposure position) must be handled as a measurement value and set at an intermediate measurement value between the peripheral circuit and memory cell portion. However, if this difference is handled as a stepping measurement value, the share of the peripheral circuit portion decreases. When measurement is done during stage stepping, and coupling between the main body structure and stage is weak, vibrations in the tilt direction remain unremoved from when the stage is decelerated until it stops. This situation will be explained below with reference to FIG. 18. In FIG. 18, the abscissa plots the step time for one shot. FIG. 18 shows a series of processes in correspondence with changes in five focus measurement values on a wafer (at measurement points which are fixed with respect to a projection lens in the measurement point layout shown in, e.g., FIG. 2). That is, stepping starts at time T0, and measurement during stepping starts at time Ts. Stability of the measurement value is detected at time T1, and the tilt and height are adjusted using the latest measurement value. Alignment in six axis directions of the exposure position is completed at a time T2 to start exposure. During the interval between TS and T1, i.e., stability of the main body structure during the focus measurement value stability confirmation period upon deceleration of the stage depends on the coupling strength or controllability of relative variation correction control. However, recently, the acceleration tends to increase to attain high-speed alignment, and the main body structure itself consequently deforms so that the wafer stage has a tilt relative to an image plane. More specifically, the posture of the stage itself deforms to obliquely dive as a result of an abrupt deceleration like diving of an automobile upon emergency braking, and gradually recovers the horizontal position during the time until the stage comes to a perfect halt. Hence, errors managed as vibration components in the conventional scheme are produced. However, in the recent trend for high NA, the tolerance of stability detection at time T1 is becoming stricter, and as a result, measurement must be repeated until the measurement value becomes stable. Consequently, the actual decrease in step time becomes smaller than the expected value.

SUMMARY OF THE INVENTION

The present invention has been made in consideration of the conventional problems, and has as its object to provide a high-precision, high-speed exposure apparatus having a method of detecting and correcting the position and tilt of the substrate surface even in the generation with a stricter depth of focus.

More specifically, an exposure method for exposing a surface to be exposed via a projection optical system after a substrate steps in a direction substantially perpendicular to an optical axis of the projection optical system to feed a plurality of shots on the substrate to a predetermined exposure position in turn, at least one of a position and tilt of the surface to be exposed of a fed shot to be exposed in the direction of the optical axis is measured during stepping, and the surface to be exposed is brought to a position of a focal plane of the projection optical system on the basis of a measurement value, comprises the step of obtaining in advance a focus offset as a measurement error resulting from different measurement points for the stepping measurement and a deformation of a main body structure in units of shots, and the step of bringing the surface to be exposed of the shot to be exposed to the position of the focal plane on the basis of a correction result of the measurement value in the stepping measurement in units of shots to be exposed using the focus offset in an exposure sequence.

An exposure method for exposing a surface to be exposed via a projection optical system after a substrate steps in a direction substantially perpendicular to an optical axis of the projection optical system to feed a plurality of shots on the substrate to a predetermined exposure position in turn, at least one of a position and tilt of the surface to be exposed of a fed shot to be exposed in the direction of the optical axis is measured during stepping, and the surface to be exposed is brought to a position of a focal plane of the projection optical system on the basis of a measurement value, comprises the step of obtaining in advance a focus offset as a measurement error resulting from different measurement points for the stepping measurement, and the step of bringing the surface to be exposed of the shot to be exposed to the position of the focal plane on the basis of a correction result of the measurement value in the stepping measurement in units of shots to be exposed using the focus offset and information of a relative positional relationship between the focal plane and surface to be exposed upon deformation of a main body structure in the stepping measurement in an exposure sequence.

An exposure method for exposing a surface to be exposed via a projection optical system after a substrate steps in a direction substantially perpendicular to an optical axis of the projection optical system to feed a plurality of shots on the substrate to a predetermined exposure position in turn, at least one of a position and tilt of the surface to be exposed of a fed shot to be exposed in the direction of the optical axis is measured during stepping, and the surface to be exposed is brought to a position of a focal plane of the projection optical system on the basis of a measurement value, comprises the step of performing the stepping measurement in units of shots for a first wafer of a plurality of wafers to be subjected to an identical exposure process, and performing a position measurement of the surface to be exposed after the shot to be exposed is fed to the exposure position, the step of obtaining and storing a focus offset as a measurement error resulting from different measurement points for the stepping measurement and a deformation of a main body structure in units of shots, using a measurement value obtained by the stepping measurement and a measurement value obtained at the exposure position, and the step of bringing the surface to be exposed of the shot to be exposed to the position of the focal plane on the basis of a correction result of the measurement value in the stepping measurement in units of shots to be exposed using the focus offset for a second wafer and subsequent wafers.

An exposure apparatus comprises a projection optical system for projecting a pattern formed on a master disk onto a photosensitive substrate, a stage which steps along a direction substantially perpendicular to an optical axis of the projection optical system while carrying the substrate to feed a plurality of shots on the substrate in turn to a predetermined exposure position, focus measurement means for measuring at least one of a position and tilt of a surface to be exposed of the substrate in a direction of the optical axis at the exposure position, focusing means for bringing the surface to be exposed to a position of a focal plane of the projection optical system, means for obtaining in advance a focus offset as a measurement error resulting from different measurement points for the stepping measurement and a deformation of a main body structure in units of shots; and correction means for correcting a measurement value of the stepping measurement using the focus offset in an exposure sequence before the measurement value is supplied to the focusing means.

An exposure apparatus comprises a projection optical system for projecting a pattern formed on a master disk onto a photosensitive substrate, a stage which steps along a direction substantially perpendicular to an optical axis of the projection optical system while carrying the substrate to feed a plurality of shots on the substrate in turn to a predetermined exposure position, focus measurement means for measuring at least one of a position and tilt of a surface to be exposed of the substrate in a direction of the optical axis at the exposure position, focusing means for bringing the surface to be exposed to a position of a focal plane of the projection optical system, means for obtaining in advance a focus offset as a measurement error resulting from different measurement points for the stepping measurement, and correction means for correcting a measurement value of the stepping measurement using the focus offset and information of a relative positional relationship between the focal plane and surface to be exposed upon deformation of a main body structure in the stepping measurement before the measurement value is supplied to the focusing means in an exposure sequence.

According to a preferred aspect of the present invention, start timings of the stepping measurements in units of shots to be exposed in the exposure sequence are synchronized with reference to a position of the shot to be exposed during stepping for feeding.

According to a preferred aspect of the present invention, the method further comprises:
  the step of confirming a position of the surface to be exposed, which has already been set in focus, at a predetermined timing after the surface to be exposed is brought to the position of the focal plane of the projection optical system using the correction result of the measurement value in the stepping measurement by the focus offset, and before exposure start; and
  the step of determining whether or not correction driving is to be redone based on the confirmation result by discriminating a residual using a given-threshold value set for each job.

According to a preferred aspect of the present invention, as means for obtaining the information of the relative positional relationship between the focal plane and surface to be exposed upon deformation of the main body structure, a pitching component of a posture of the stage is measured.

According to a preferred aspect of the present invention, as means for obtaining the information of the relative positional relationship between the focal plane and surface to be exposed upon deformation of the main body structure, a pitching amount in a step direction, which is measured in advance, is held as a table.

According to a preferred aspect of the present invention, start timings of the stepping measurements in units of shots to be exposed in the exposure sequence are synchronized with reference to a position of the shot to be exposed during stepping for feeding.

According to a preferred aspect of the present invention, the method further comprises the step of confirming a position of the surface to be exposed, which has already been set in focus, at a predetermined timing after the surface to be exposed is brought to the position of the focal plane of the projection optical system using the correction result of the measurement value in the stepping measurement by the focus offset, and before exposure start, and the step of determining whether or not correction driving is to be redone based on the confirmation result by discriminating a residual using a given threshold value set for each job.

According to a preferred aspect of the present invention, the method further comprises the step of performing a measurement at the exposure position after the surface to be exposed is brought to the position of the focal plane of the projection optical system using the correction result of the measurement value at a stepping measurement point using the focus offset for the second wafer and subsequent wafers, and the step of re-calculating the focus offset on the basis of the measurement result.

According to a preferred aspect of the present invention, the method further comprises the step of performing a measurement at the exposure position after the surface to be exposed is brought to the position of the focal plane of the projection optical system using the correction result of the measurement value at a stepping measurement point using the focus offset for the second wafer and subsequent wafers, and the step of finely adjusting a position of the surface to be exposed.

According to a preferred aspect of the present invention, measurement start timings upon executing the stepping measurement using the focus measurement means are synchronized with reference to a stage position.

According to a preferred aspect of the present invention, the apparatus further comprises means for confirming a position of the surface to be exposed, which has already been set in focus, at a predetermined timing after the surface to be exposed is brought to the position of the focal plane of the projection optical system using the correction result of the measurement value in the stepping measurement by the focus offset, and before exposure start, and determining whether or not correction driving is to be redone based on the confirmation result by discriminating a residual using a given threshold value set for each job.

According to a preferred aspect of the present invention, the apparatus further comprises means for obtaining the information of the relative positional relationship between the focal plane and the surface to be exposed upon deformation of the main body structure by measuring a pitching component of a posture of the stage.

According to a preferred aspect of the present invention, a table that stores pitching amounts in step directions, which amounts are measured in advance, is held as the relative positional relationship between the focal plane and the surface to be exposed upon deformation of the main body structure.

According to a preferred aspect of the present invention, measurement start timings upon executing the stepping measurement using the focus measurement means are synchronized with reference to a stage position.

According to a preferred aspect of the present invention, the apparatus further comprises means for confirming a position of the surface to be exposed, which has already been set in focus, at a predetermined timing after the surface to be exposed is brought to the position of the focal plane of the projection optical system using the correction result of the measurement value in the stepping measurement by the focus offset, and before exposure start, and determining whether or not correction driving is to be redone based on the confirmation result by discriminating a residual using a given threshold value set for each job.

According to a preferred aspect of the present invention, a semiconductor device is manufactured by the exposure method.

According to a preferred aspect of the present invention, the focus offset is obtained on the basis of a measurement error resulting from an intra-chip step produced when a position of the surface to be exposed is measured at the exposure position.

According to a preferred aspect of the present invention, the means for obtaining the focus offset obtains the focus offset on the basis of a measurement error resulting from an intra-chip step produced when a position of the surface to be exposed is measured at the exposure position.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

DETAILED DESCRIPTION OF THE INVENTION

Figure 1:
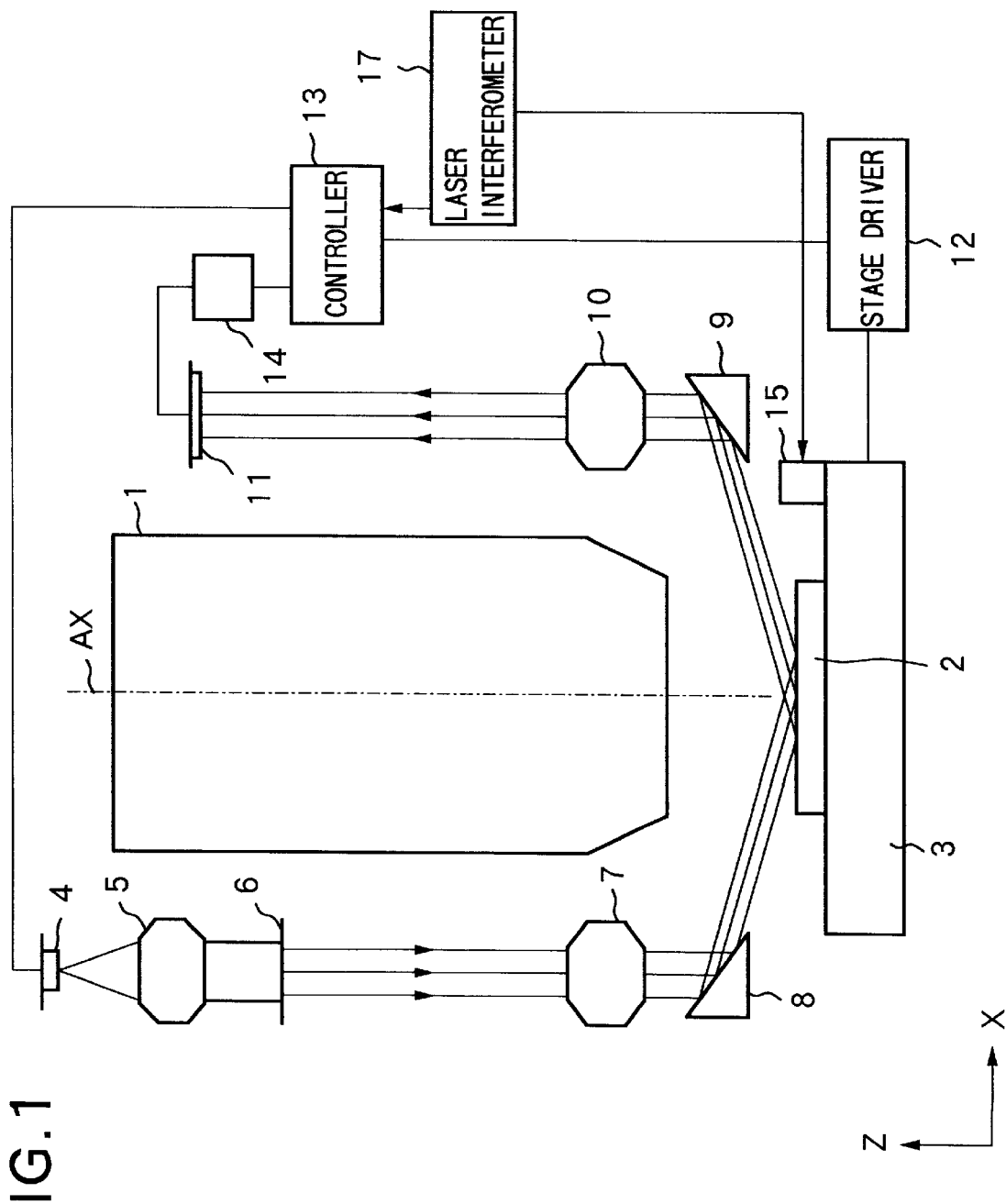
FIG. 1 is a partial schematic view of a step & repeat reduction projection exposure apparatus according to an embodiment of the present invention.

Preferred embodiments of the present invention will be described in detail in accordance with the accompanying drawings.

According to a preferred embodiment of the present invention, an exposure apparatus which has a stage for stepping in a direction substantially perpendicular to the optical axis of a projection optical system while carrying a wafer to feed a predetermined shot of the wafer to an image plane of the projection optical system, and a detector for detecting at least one of a position and tilt in the optical axis direction at a predetermined position (surface) of the wafer, and brings the predetermined surface to the position of a focal plane of the projection optical system on the basis of the detection value of the detector, is characterized by comprising means for calculating in advance an error (first focus offset) resulting from an intra-chip step at an exposure position by the detector, and means for calculating in advance an error (second focus offset) resulting from an intra-chip step and a deformation of a main body structure in each shot to be subjected to stepping focus measurement, and in that the predetermined shot is brought to the position of the focal plane of the projection optical system on the basis of a correction result of a measurement value at a stepping measurement point using the second focus offset at the stepping measurement point of each shot in an exposure sequence. With this apparatus, reproducible offset changes during stepping can be sampled at a predetermined timing, and focus correction can be started at a reliable position during stepping, thus surely shortening the step time as compared to the conventional method that waits for the measurement point to stabilize. This exposure apparatus is characterized in that the measurement start timing of a focus detection sensor used in stepping measurement is synchronized with the stage position. That is, an error (second focus offset) resulting from an intra-chip step and a deformation of the main body structure in each shot upon executing the stepping focus measurement can be accurately obtained without producing any timing offset (position, vibration period). Furthermore, this exposure apparatus is characterized in that the focus correction completion position is checked with reference to the image plane at a predetermined timing after correction using the measurement value during stepping and before the beginning of exposure, and whether or not correction driving is to be redone is determined based on the checking result by discriminating the residual using a given threshold value set in units of jobs. With this processing, desired precision and processing speed can be selected in correspondence with the required resolutions of each individual processes.

According to another preferred embodiment of the present invention, an exposure apparatus which has a stage for stepping in a direction substantially perpendicular to the optical axis of a projection optical system while carrying a wafer to feed a predetermined shot of the wafer to an image plane of the projection optical system, and a detector for detecting at least one of a position and tilt in the optical axis direction at a predetermined position (surface) of the wafer, and brings the predetermined surface to the position of a focal plane of the projection optical system on the basis of the detection value of the detector, is characterized by comprising means for calculating in advance an error (first focus offset) resulting from an intra-chip step at an exposure position by the detector, and means for calculating in advance an error (second focus offset) resulting from an intra-chip step in each shot to be subjected to stepping focus measurement, and in that the predetermined shot is brought to the position of the focal plane of the projection optical system based on a correction result of stepping measurement data using the second focus offset and information of a relative positional relationship between an exposure image plane and a surface to be exposed upon deformation of a main body structure in stepping focus measurement at a stepping measurement point of each shot in an exposure sequence. Since changes in posture caused by the deformation of the main body structure are measured in units of shots or are managed as offsets measured in advance in units of step directions, the step directions need only be managed as the types of offset to be held upon correction of the stepping measurement value. Also, this exposure apparatus is characterized in that the measurement start timing of a focus detection sensor used in stepping measurement is synchronized with the stage position. That is, an error (second focus offset) resulting from an intra-chip step and a deformation of the main body structure in each shot upon executing the stepping focus measurement can be accurately obtained without producing any timing offset (position, vibration period).

Furthermore, this exposure apparatus is characterized in that the focus correction completion position is checked with reference to the image plane at a predetermined timing after correction using the measurement value during stepping and before the beginning of exposure, and whether or not correction driving is to be redone is determined based on the checking result by discriminating the residual using a given threshold value set in units of jobs. With this processing, desired precision and processing speed can be selected in correspondence with the required resolutions of each individual processes.

In the third preferred embodiment of the present invention, the processes for the first wafer are done in the order of "driving of a wafer stage—surface position detection 1 (stepping measurement point)—stop—surface position detection 2 (exposure position measurement point)—surface position adjustment—calculation and storage of measurement offsets of stepping measurement points". In these processes, the surface position adjustment uses the result in surface position detection 2. As for the exposure position measurement, since the measurement offset (first focus offset) can be managed by the conventional technique, an optimal focus setting plane can be accurately detected, and the surface position can be precisely adjusted. Since the optimal focus setting plane remains the same in a shot area, the measurement offset (second focus offset) of the stepping measurement point can be obtained by calculating the difference between the detection value of surface position detection 1 and optimal focus setting plane. The measurement offset of the stepping measurement point is stored for each shot, and is used in the processes of the second wafer and subsequent wafers. The processes for the second wafer and subsequent wafers are done in the order of "driving of the wafer stage—surface position detection (stepping measurement point)—surface position adjustment and stop". Since the measurement offsets of the stepping measurement points are already stored upon processing the first wafer, high-precision processes can be made. That is, an optimal focus setting plane can be accurately detected during stepping measurement, and precise alignment (focusing) can be done.

In addition to the above processes, in the exposure sequence of the shot to be exposed on the second wafer and subsequent wafers, an optimal focus setting plane is accurately obtained using the exposure position measurement point after alignment based on the stepping measurement result, and any error between the optimal focus setting surface and the focal plane (image plane) of the projection optical system is measured so as to recalculate and correct the measurement offset of the stepping measurement point. Alternatively, in the exposure sequence of the shot to be exposed on the second wafer and subsequent wafers, the optimal focus setting surface is re-detected using the exposure position measurement point after alignment based on the stepping measurement result, and when the error of the measurement value obtained by the stepping measurement is larger than a predetermined value, the alignment is finely adjusted using the re-detected value. By adding the former process, even when random disturbances such as a warp of the wafer, stage vibrations, and the like are produced, an optimal focus setting plane can be precisely aligned to the image plane. Also, by adding the latter process, even when the stepping measurement precision worsens due to vibrations during stage driving, high exposure precision equivalent to that of the exposure position measurement can be assured.

The preferred embodiments of the present invention will be described hereinafter with reference to the accompanying drawings.

First Embodiment

Figure 2:
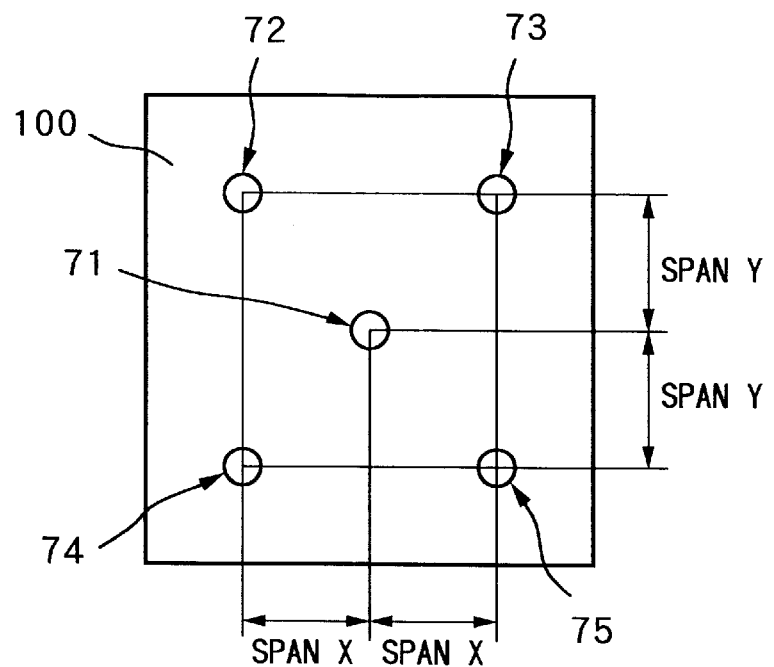
FIG. 2 is an explanatory view showing the layout of exposure position measurement points set in an area to be exposed in the embodiment shown in FIG. 1.

FIG. 1 is a partial schematic view showing a principal part of a reduction projection exposure apparatus comprising an auto-focusing device according to an embodiment of the present invention. Referring to FIG. 1, reference numeral 1 denotes a reduction projection lens, the optical axis of which is indicated by AX in FIG. 1. The reduction optical lens 1 projects the circuit pattern on a reticle (not shown) at a reduced scale of, e.g., 1/5 to form a circuit pattern image on its focal plane. The optical axis AX is parallel to the z-direction in FIG. 1. Reference numeral 2 denotes a wafer applied with a resist on its surface, on which a large number of areas to be exposed (shots) formed with identical patterns in the previous exposure processes is defined. Reference numeral 3 denotes a wafer stage that mounts the wafer. The wafer 2 is chucked and fixed on the wafer stage 3. The wafer stage 3 is comprised of an x-stage which moves in the x-direction, a y-stage which moves in the y-direction, and a θ· leveling stage which moves in the z-direction and is rotatable about axes parallel to the x-, y-, and z-directions. The x-, y-, and z-axes are orthogonal to each other. Hence, by driving the wafer stage 3, the surface position of the wafer 2 is adjusted in the direction of the optical axis AX of the reduction projection lens 1 and in a direction along a plane perpendicular to the optical axis AX, and also the tilt with respect to the focal plane, i.e., the circuit pattern image, is adjusted. Reference numerals 4 to 11 in FIG. 1 denote the respective elements of detection means for detecting the surface position and tilt of the wafer 2. That is, reference numeral 4 denotes an illumination light source, e.g., a high-luminance light source such as a light-emitting diode, semiconductor laser, or the like. Reference numeral 5 denotes an illumination lens. Light emitted by the light source 4 is converted into collimated light by the illumination lens 5, and the collimated light illuminates a mask 6 formed with a plurality of (e.g., five) pinholes. A plurality of light beams that leave the pinholes of the mask 6 are incident on a bending mirror 8 via an imaging lens 7, and change their directions by the bending mirror 8. After that, these light beams are incident on the surface of the wafer 2. The imaging lens 7 and bending mirror 8 form a plurality of pinhole images of the mask 6 on the wafer 2. The light beams passing through the plurality of pinholes irradiate five portions (71 to 75) including the central portion of an area 100 to be exposed of the wafer 2, as shown in FIG. 2, and are reflected by these portions. More specifically, in this embodiment, five pinholes are formed on the mask 6, and the positions of five measurement points (71 to 75) including the central portion in the area 100 to be exposed are measured, as will be described later. Light beams reflected by the respective measurement points (71 to 75) on the wafer 2 are bent by a bending mirror 9, and are then incident on a position detection element 11 having a two-dimensional array of elements via a detection lens 10. The detection lens 10 forms the pinhole images of the mask 6 on the position detection element 11 in cooperation with the imaging lens 7, bending mirror 8, wafer 2, and bending mirror 9. That is, the mask 6, wafer 2, and position detection element 11 are located at optically conjugate positions.

If such an arrangement schematically shown in FIG. 1 is hard to attain in terms of the optical layout, a plurality of position detection elements 11 may be disposed in correspondence with the respective pinholes. The position detection element 11 comprises a two-dimensional CCD or the like, and can independently detect the incident positions of a plurality of light beams via the plurality of pinholes on the light-receiving surface of the position detection element 11. Since a change in position of the wafer 2 in the direction of the optical axis AX of the reduction projection lens system 1 can be detected as offsets of the incident positions of the plurality of light beams on the position detection element 11, the positions of the wafer surface in the direction of the optical axis AX at the five measurement points (71 to 75) in the area 100 to be exposed on the wafer 2 are input to a controller 13 via a surface position detector 14 as the output signals from the position detection element 11. Displacements of the wafer stage 3 in the x- and y-directions are measured using a reference mirror 15 and laser interferometer 17 set on the wafer stage by a known method, and a signal indicating the displacement amount of the wafer stage 2 is input from the laser interferometer 17 to the controller 13 via a signal line. Movement of the wafer stage 3 is controlled by a stage driver 12. The stage driver 12 receives a command signal from the controller 13 via a signal line, and servo-drives the wafer stage 3 in response to this signal. The stage driver 12 has first and second drive means, adjusts the position (x, y) and rotation (θ) of the wafer 2 in the plane perpendicular to the optical axis AX using the first drive means, and adjusts the position (z) and tilt (α, β) of the wafer 2 in the direction of the optical axis AX using the second drive means. The surface position detector 14 processes based on the output signals (surface position data) from the position detection element 11, and detects the surface position of the wafer 2. The detector 14 transfers the detection result to the controller 13, and the second drive means of the stage driver 12 operates in accordance with a predetermined command signal to adjust the position and tilt of the wafer 2 in the direction of the optical axis AX.

Focus detection positions in this embodiment will be explained below. In this embodiment, basically, stepping measurement points used for calculating the correction drive amount, and exposure position measurement points for an offset calculation reference, which are mainly used for correcting the measurement values at the measurement points to be equivalent to that at the exposure position, are set. FIG. 2 shows the exposure position measurement points. A measurement point 71 is located at nearly the central portion of the area 100 to be exposed, and intersects the optical axis AX at the exposure position. The remaining measurement points 72 to 75 are located on the peripheral portions of the area 100 to be exposed. In this way, at the normal exposure position measurement points, the respective sensors individually measure the step shapes of identical chips in all the shots in the wafer, and offset values resulting from the step shape in the respective sensors using the image plane as a reference plane are uniquely determined in units of sensors. Hence, when the positions in the tilt and height directions of a chip aligned to the exposure position are detected by a conventional method, offsets need not be changed in units of shots.

Figure 3:
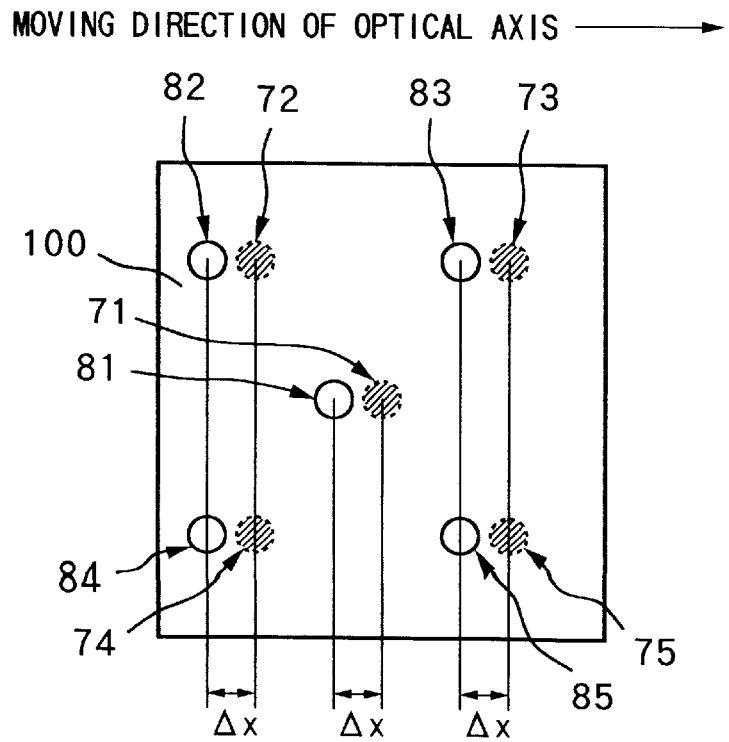
FIG. 3 is an explanatory view showing the layout of stepping measurement points, which are set in the area to be exposed in the embodiment shown in FIG. 1.

FIG. 3 shows an example of stepping measurement points used in measurements during stepping. FIG. 3 illustrates a state wherein a measurement point 81 is measured during stepping in place of the measurement point 71 at the intersection of the optical axis AX. That is, the wafer steps from the right to the left in FIG. 3, and the respective measurement points 71 to 75 respectively shift to positions 81 to 85 to their left on the chip.

When a measurement is made during stepping, a surface having a step structure, which is different from the exposure position in a strict sense, is measured at a position relative to the chip. Even a shot layout including only twelve shots shown in FIG. 4 has five different measurement points (left, right, upper right, upper left, and upper), and has a maximum of eight different stepping measurement points. In addition, changes in main body structure during the stepping measurement period assume different values in units of shots as displacements in the z-direction as the products of the measurement values and a posture deformation (α, β) even if it remains the same after each stepping, and the shot positions (x, y) from the center, from the relationship between the shot position (x, y) on the wafer and posture deformation (α, β) at that time. However, since this main body deformation reportedly has a high reproducibility after each stepping, it can be managed as an offset for each shot in the same manner as offsets produced by intra-shot steps.

Figure 5:
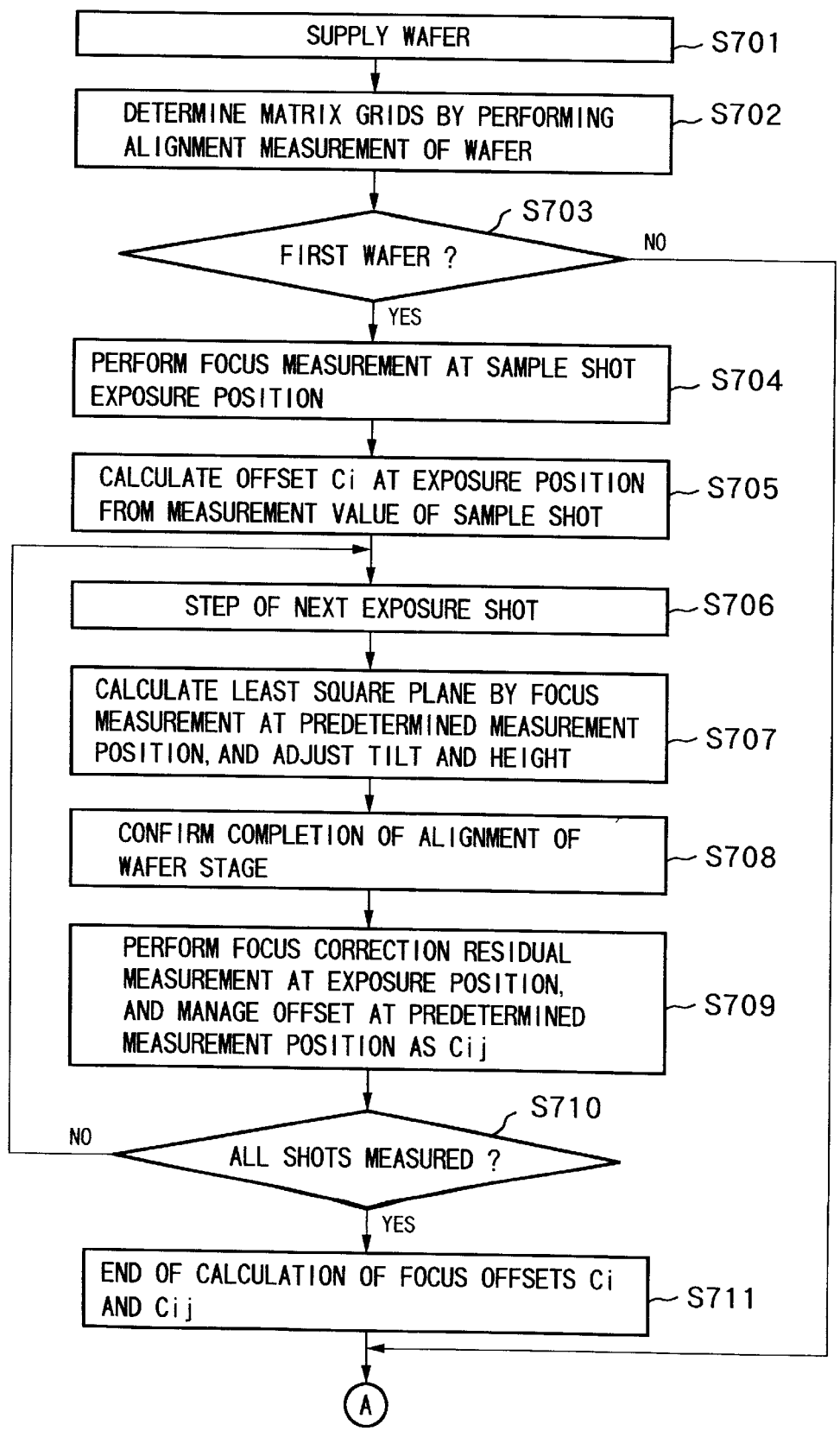
FIG. 5 is a flow chart showing an example of the measurement sequence for the focus offset of each shot stepping measurement point in the apparatus shown in FIG. 1.

This embodiment will be described in detail below with reference to the flow chart in FIG. 5. In step S701, wafer supply means (not shown) supplies a wafer 2 with a pattern onto the wafer stage 3. In step S702, an alignment mechanism (not shown) measures the positional displacements of the wafer 2 in the x- and y-directions with respect to the optical axis AX and a reference layout of the wafer stage 3, and grids used for stepping the wafer stage in correspondence with those of the shot layout transferred onto the wafer are calculated and stored in the controller 13. In this manner, offsets resulting from the step shape in units of focus sensors in each shot at the exposure position can be uniquely determined. In a method of measuring the focus offset of each focus sensor resulting from the step structure at the exposure position, a focus measurement of a sample shot is made (S704) to calculate a surface shape function for the first wafer (S703), and a focus offset (first focus offset) at the exposure position is obtained as a constant term Ci (i is the focus measurement point number; i=0 to 4 in this embodiment) (S705), thus calculating offsets of the respective sensors with respect to the image plane at the exposure position, as described in Japanese Patent Publication No. 6-52707 filed by the present applicant.

Subsequently, a method of measuring measurement offsets at the stepping measurement points will be explained below also with reference to the flow chart of FIG. 5. The method basically exploits the fact that tilt and height data of the position to be exposed with respect to the exposure image plane calculated using the measurement values obtained at the stepping measurement points include two different offsets, i.e., a measurement error arising from measurements at positions (81 to 85) shifted from the measurement points (71 to 75) at the exposure position, and a measurement error produced by the deformation of the main body structure, and these errors (second focus offsets) can be directly measured as residuals in focus measurement values (corrected by the first focus offsets ci) at the exposure position after correction driving based on the measurement values including those errors. That is, stepping to the next shot starts in step S706. In step S707, it is determined that predetermined stepping measurement points (i.e., points to be measured determined based on data from the laser interferometer 17 of the stage) have been reached, and the tilt and height data at the position to be measured are calculated. Using these data, correction driving is done using the second drive means of the wafer stage 3. Since reproducibility of the pattern position and a variation mode of the main body deformation are important for the measurement values, it is important for the focus detection system to use an arrangement which assures their concurrence, i.e., it is important for an accumulation position detection element to reset the accumulation cycle in synchronism with the position to be detected. Also, even in a high-speed sampling detection method for obtaining the average of a large number of measurement results, a hardware timing notifying scheme that can assure synchronization with the position to be measured is required. After that, it is confirmed in step S708 that alignment using the first and second drive means of the wafer stage 2 is complete. A focus measurement is done at the exposure position in step S709, and data are corrected using the constant term (Ci) of the first focus offset with respect to the exposure image plane at the exposure position calculated in step S705. The corrected data are the two measurement errors included in the measurement data at the stepping measurement points, and are managed in each job as data in units of shots (j) as a focus offset (second focus offset) Cij (j: shot number). In step S710, the offsets Cij are measured on all the shots by managing an all-shot measurement loop. In steps S706 to S710, measurement offsets of stepping measurement points of each exposure shot with respect to the exposure image plane at the exposure position of that shot are measured as data in units of shots, and are managed in each job. In such a way, errors attributed to chip steps and a deformation of the main body structure included in the measurement values at the stepping measurement points are measured in advance and are managed in units of shots, thus guaranteeing high correction precision at the exposure position.

Figure 6:
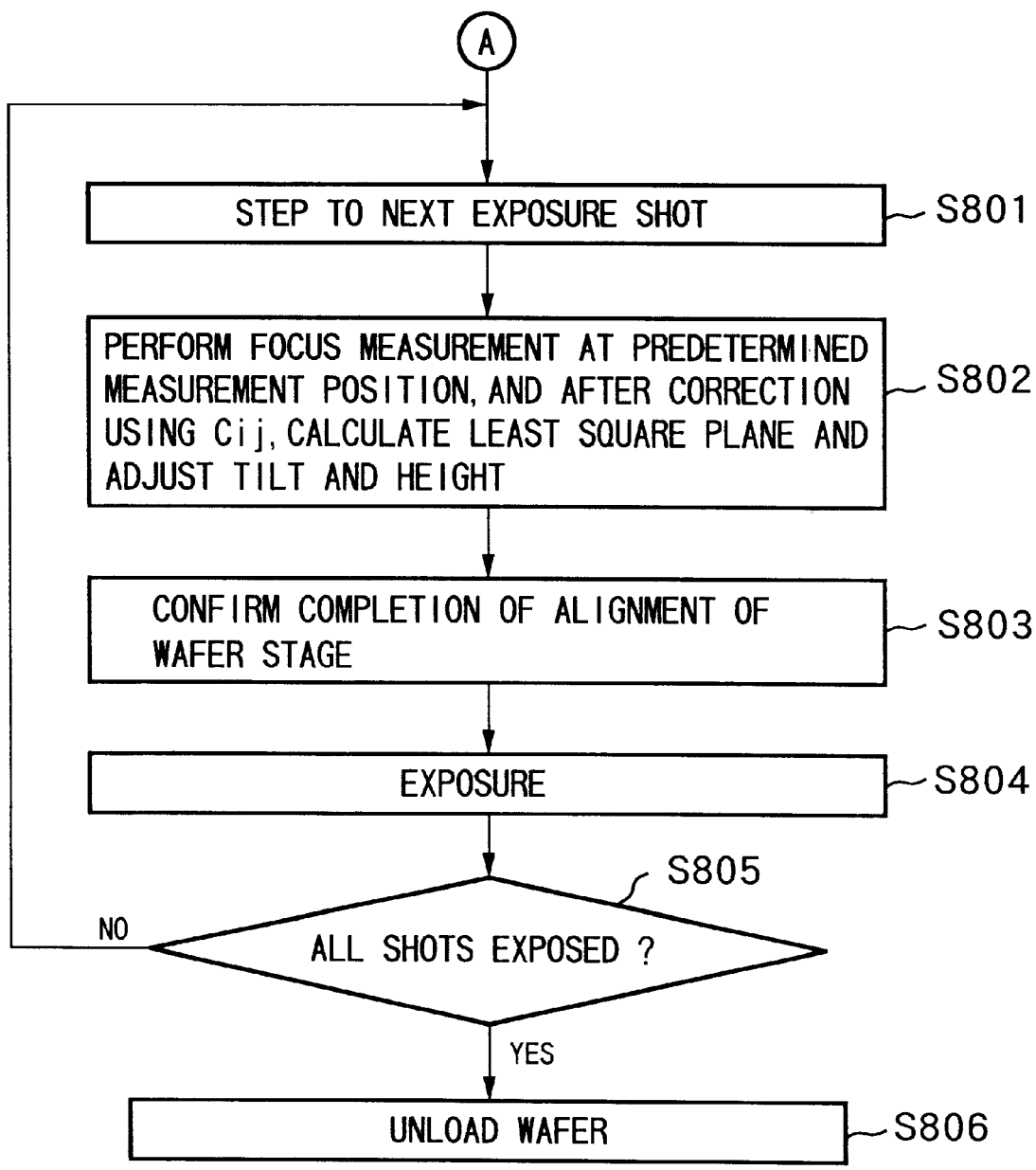
FIG. 6 is a flow chart showing an example of focusing using a measurement value at each shot stepping measurement point by the apparatus shown in FIG. 1.

The correction- exposure sequence for each shot will be explained below with reference to FIG. 6. In step S801, stepping to an exposure shot starts. In step S802, it is determined that predetermined stepping measurement points (i.e., points to be measured determined based on data from the laser interferometer 17 of the stage) have been reached, and a focus measurement is made. Tilt and height data of the position to be exposed at that position are corrected by calculations using the measurement result and Cij above, and correction is made based on the corrected data using the second drive means of the wafer stage 3. In this fashion, since measurement, data correction, and driving can be immediately done when predetermined stepping measurement points have been reached, the step time can be further shortened as compared to the method which passively waits until stable measurement values are obtained during the interval between TS and T1, as previously proposed by the present applicant in Japanese Patent Application No. 4-116414. Subsequently, after it is confirmed in step S803 that alignment in all the six axes is complete, the shot of interest is exposed in step S804. It is then checked in step S805 if all the shots have been processed. The sequence in steps S801 to S805 repeats itself until exposure of all the shots is completed. If it is determined that exposure of all the shots is complete, the wafer is unloaded in step S806.

In this embodiment, a wafer with a pattern has been mainly described. However, this embodiment may be applied to a wafer without any pattern called the 1st mask process, and errors resulting from a deformation of the structure are measured as offsets in advance, thus correcting errors included in the stepping measurement values and reliably shortening the step time. In this embodiment, the focus measurement values (residuals) at the exposure position after correction driving using the measurement values obtained at the stepping measurement points are managed as the second focus offsets (Cij). Alternatively, a measurement alone is made at the stepping measurement points, and a focus measurement is made again when the exposure position is reached. The differences between these measurement results may be managed in units of shots as second focus offsets (Cij).

Second Embodiment

Figure 7:
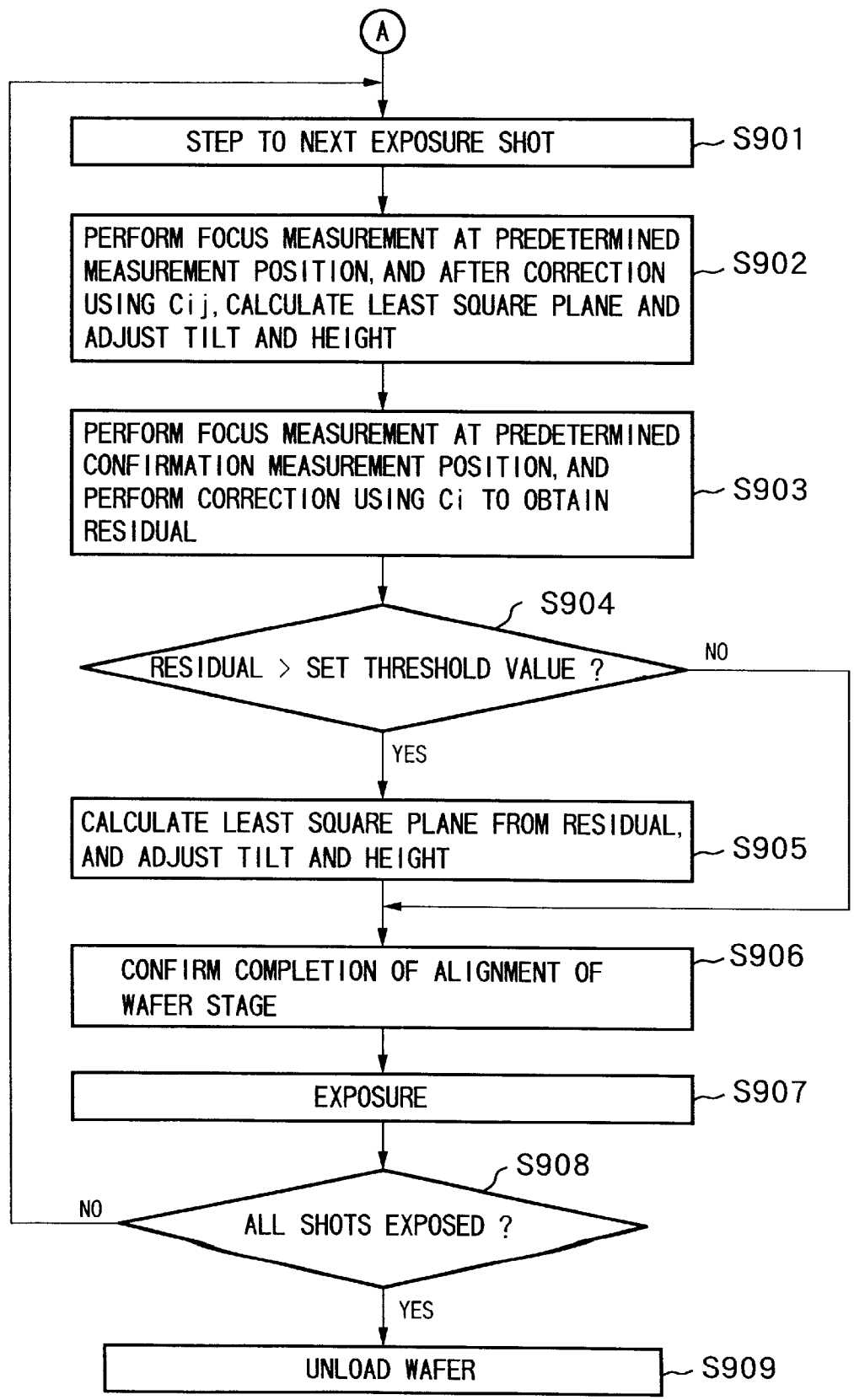
FIG. 7 is a flow chart showing another example of focusing using a measurement value at each shot stepping measurement point by the apparatus shown in FIG. 1.

The second embodiment of the present invention will be described below with reference to FIG. 7. The difference from the first embodiment lies in that a focus measurement is made at a timing after tilt height correction in step S802 and before it is checked in step S803 if alignment is complete, in the flow chart shown in FIG. 6. In the sequence of this embodiment, since correction of tilt and height data, i.e., correction driving of the second drive means of the wafer stage 3 can be started at an earlier timing, correction of the second drive means is completed sufficiently before that of the second drive means of the wafer stage 3 as for alignment in the six axes required for exposure. In addition, since alignment of the first drive means during this period, i.e., alignment result in the horizontal direction has already fallen within the range of 1 $\mu$m or less, a measurement using the offsets Ci quite equivalent to those at the exposure position can be made. That is, since the conventional method waits until stable measurement values are obtained, the correction timing of the second drive means cannot be set to be sufficiently early. However, in this embodiment, offset correction is positively made, and correction driving can be started earlier. Consequently, the correction result of the second drive means can be confirmed and measured as the alignment result of the image plane in the focus detection system in addition to confirmation using a drive amount sensor attached to a conventional drive system, without prolonging the step time. More specifically, in steps S901 and S902, the same processing as in steps S801 and S802 are done. In step S903, completion of measurement at second predetermined position measurement points, i.e., second alignment, is detected, and a measurement is made using Ci in a state wherein a first alignment is not complete yet, but alignment precision high enough to make a focus measurement is assured (e.g., the alignment result of the first drive means falls within the range of 1 $\mu$m or less). The error amount measured in this step is an amount to be processed as a Cij error component, and can be considered as a lot difference produced by data obtained by the first wafer. Since this residual amount is expected to be very small, the time required for correcting this residual amount can be minimized. That is, the obtained focus measurement value is corrected by calculations using Ci in step S903. In step S904, the measurement value is checked using the tolerance managed in each job. If it is determined in step S904 that driving is to be done, the difference from the exposure image plane is calculated based on surface data obtained by the method of least squares from the respective correction measurement values, and final correction driving is done using the second drive means of the wafer stage 3 in step S905. After it is confirmed in step S906 that alignment in all the six axes is complete, the shot of interest is exposed in step S907. It is then checked in step S908 if all the shots have been processed. The sequence in steps S901 to S908 repeats itself until exposure of all the shots is completed. If it is determined that exposure of all the shots is complete, the wafer is unloaded in step S909. The tolerance in step S904 can be set in consideration of the depth of focus determined based on the minimum line width in units of set jobs, i.e., processes. That is, in a process that requires a maximum resolution, the tolerance may be set at a value around the upper limit of focus measurement reproducibility so as to set the measurement value within the depth of focus. On the other hand, in, e.g., a middle layer, the tolerance may be set at a value within the allowable range of budget, thus generating a job that places an importance on processing speed.

Also, the reliability of Cij data may be improved using the Cij error value calculated in step S903 by:

$$\text{NEW\_Cij} = (n \times \text{NOW\_Cij} + \text{OFS})/(n + 1) \qquad (1)$$

where OFS: the latest offset measured on the correction shot
NOW_Cij: the current offset
NEW_Cij: the updated offset
n: the stepping average period.

Third Embodiment

Figure 8:
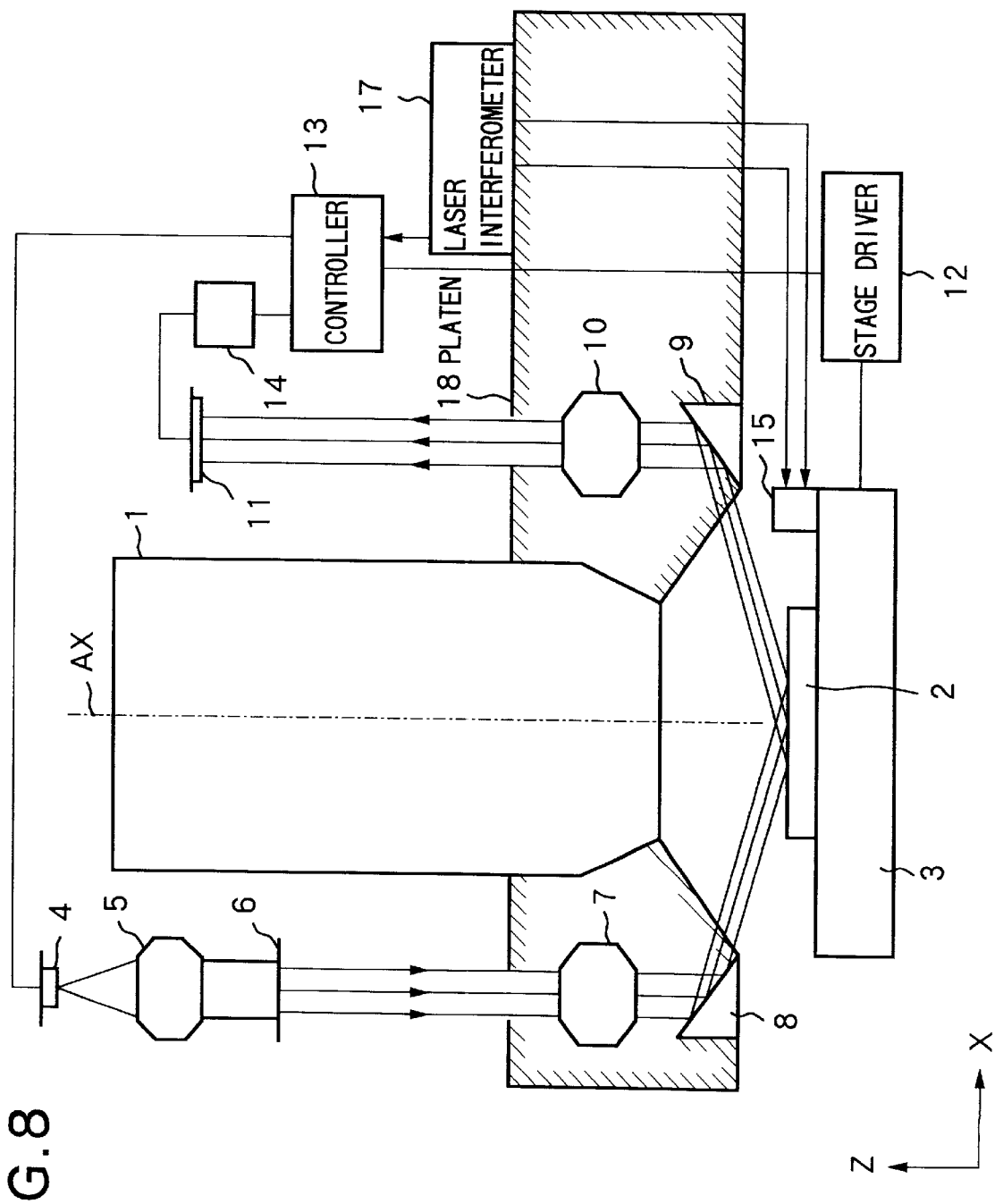
FIG. 8 is a partial schematic view of a step & repeat reduction projection exposure apparatus according to another embodiment of the present invention.
Figure 9:
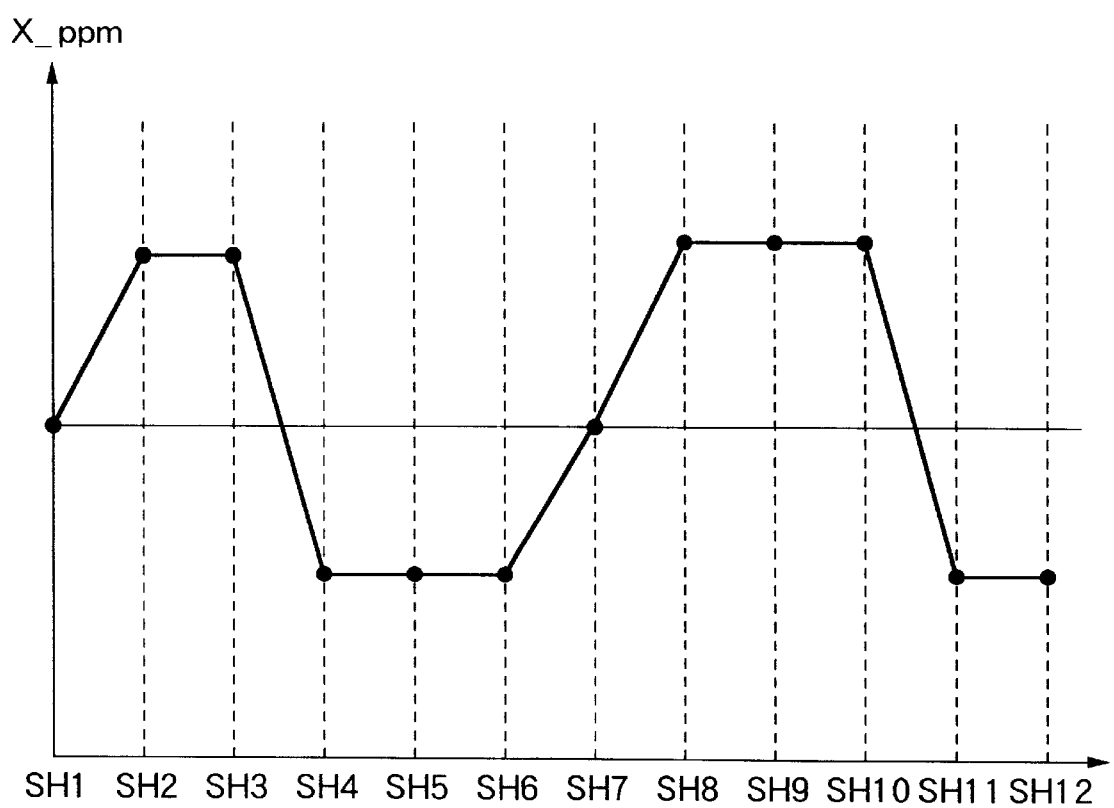
FIG. 9 is a graph showing an example of the x-tilt amount (pitching) measured at a predetermined stepping measurement position of a wafer stage.

The embodiments for managing focus offsets at the stepping measurement points in units of shots have been explained. A method of managing such offsets using a minimum number of offsets will be explained below as the third embodiment. As described above, the error factors of the focus measurement values included in stepping measurement values include an error component produced by different influences of intra-chip steps from those at the exposure position measurement points, and an error component resulting from a deformation of the main body structure during stepping. The influences of intra-chip steps as the former factor can be removed by offset management that takes eight step directions (four oblique directions in addition to four, upper, lower, right, and left directions) into consideration, as the exposure chip structure is uniform in a wafer except for, e.g., an ASIC manufactured by a plurality of jobs, i.e., masks. Such directions can be calculated by expanding the calculation method of surface shape function proposed by the present applicant in Japanese Patent Publication No. 6-52707 from the exposure position alone to the eight directions. An offset resulting from a deformation of the main body structure during stepping as the latter factor is traced back to the tilt of the surface to be exposed with respect to the exposure image plane, i.e., a focus measurement plane, and the offset amount at that position in the height direction can be calculated as rxω using a shot position r and the tilt amount ω. More specifically, as shown in FIG. 8, the laser interferometer 17 which has a reference position defined by a platen 18 for fixing the projection lens 1 and focus detection system outputs two laser beams in the vertical direction toward the reference mirror 15, and the tilt amount of the wafer stage 3 with respect to the exposure image plane is measured as a pitching amount ω, thus obtaining offsets resulting from a deformation of the main body structure during stepping in units of shots by calculations. FIG. 9 shows an example of the measurement results of a stage pitching amount upon focus measurement at the stepping measurement points in the layout shown in FIG. 4 using the arrangement shown in FIG. 8. Since the measurement in FIG. 9 uses a mirror-surface wafer before transferring any pattern called a bare-Si wafer, measurement values appearing in focus detection values detected at the stepping measurement points include only components resulting from a deformation of the main body structure, and match the pitching measurement amounts of the laser interferometer shown in FIG. 9 as the focus measurement values of tilt amounts. As can be seen from FIG. 9, when the wafer stage starts stepping from the upper right shot in FIG. 4 as the start position and steps in the x-direction along the arrows in FIG. 4, constant tilt amounts are measured depending on the stepping directions. A value obtained by multiplying the measured amount by the x-coordinate of each shot position is a correction offset in the height direction, and the measured tilt amount can be directly used as the correction offset in the tilt direction. In FIG. 9, the x-direction alone has been explained, but the same applies to pitching measurement in the y-direction. Using the above-mentioned methods of positively measuring offsets for direction management and the main body deformation as measures of the above two error factors, the memory capacity required for storing offset data can be reduced, and the time required for measuring offsets in advance can be shortened.

Figure 10:
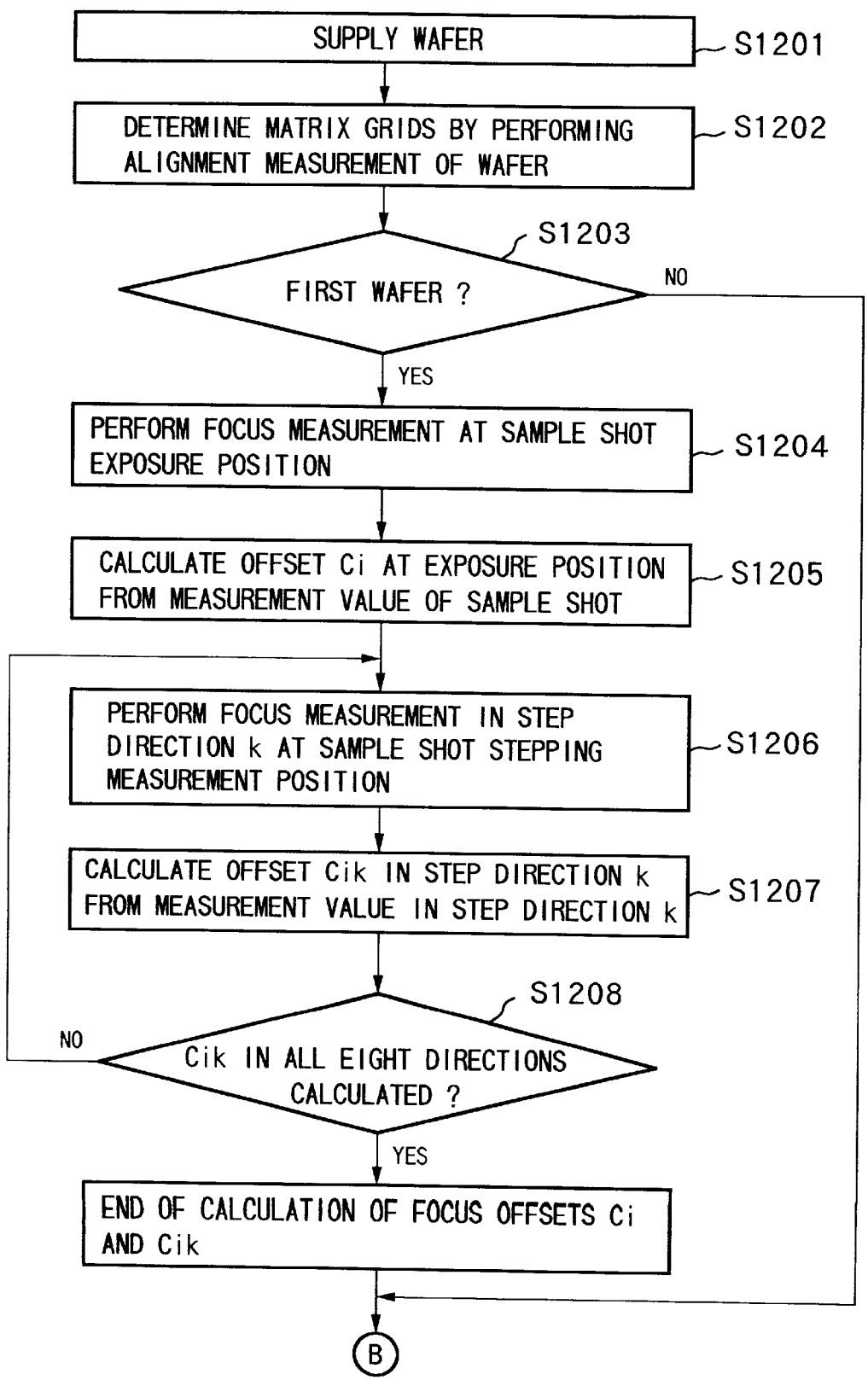
FIG. 10 is a flow chart showing an example of the measurement sequence for the focus offset of each shot stepping measurement point in the apparatus shown in FIG. 8.
Figure 17:
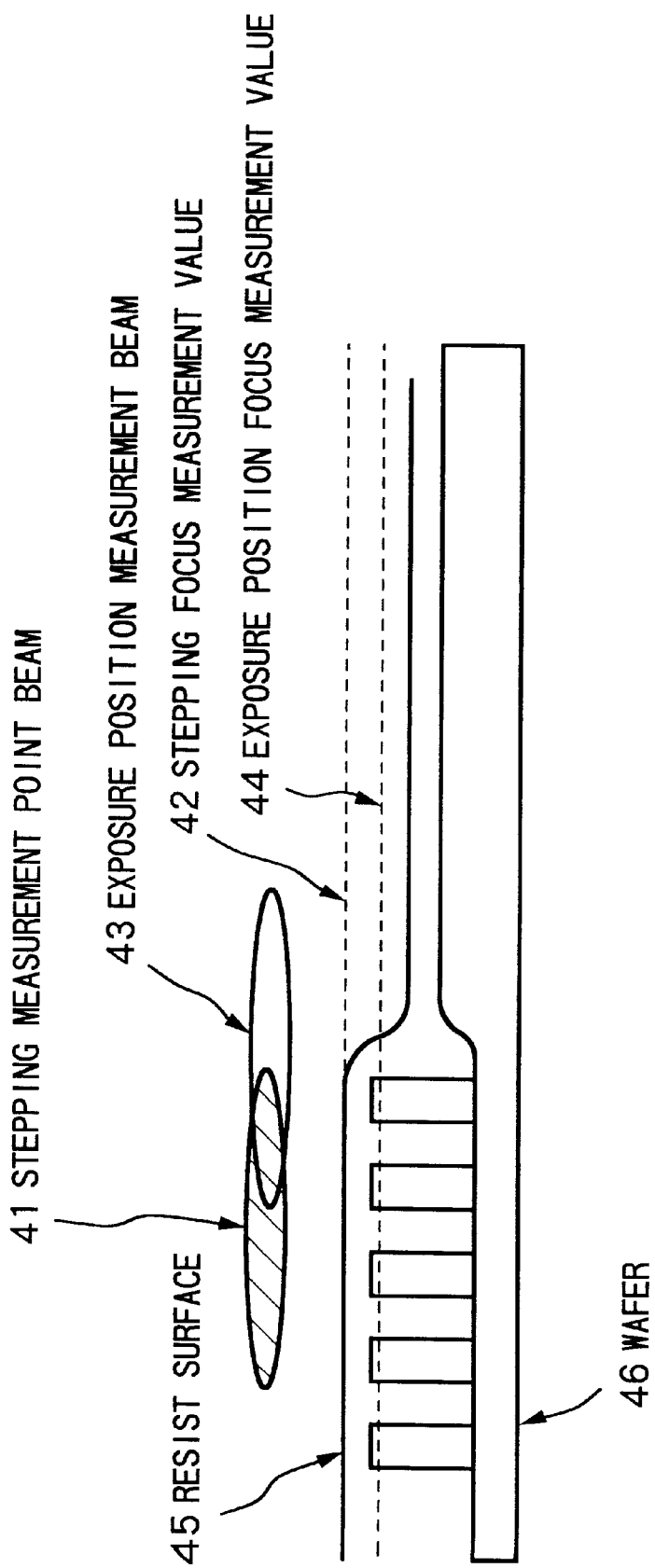
FIG. 17 is a wafer sectional view showing the differences of focus detection positions between the exposure position measurement point and stepping measurement point.
Figure 18:
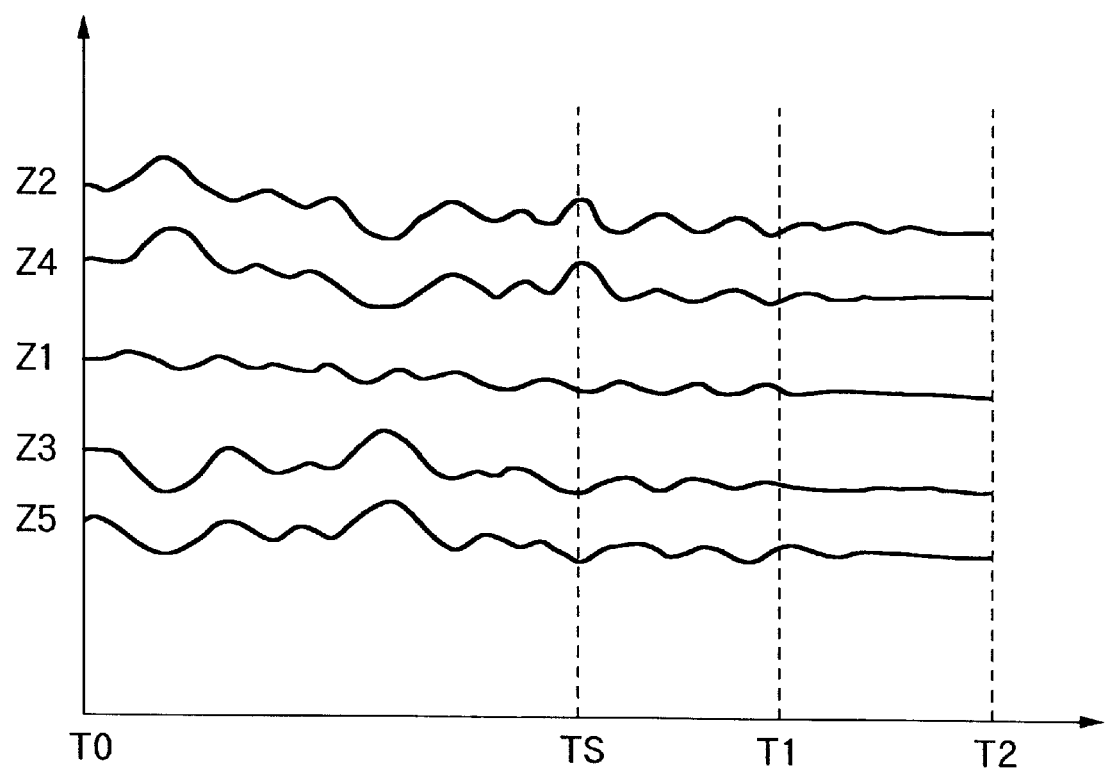
FIG. 18 is a graph showing an example of changes in measurement values at the respective focus measurement points during stepping of a wafer stage.

The method of obtaining offsets of the stepping measurement points in the eight directions with reference to an offset at the exposure position will be explained below with reference to the flow chart in FIG. 10. In step S1201, a wafer with a pattern is supplied. In step S1202, alignment measurement of the wafer is done to guarantee reproducibility in the horizontal direction of the chip structure at the focus measurement positions to determine step & repeat layout grids. In step S1203, it is checked if the wafer of interest is the first one of a lot, and offsets (first focus offsets) Ci (i=0 to 4; focus measurement points) of the respective sensors with respect to the exposure image plane at the exposure position are calculated according to the method of Japanese Patent Publication No. 6-52707. In steps S1206 to S1208, offsets (second focus offsets) Cik (k=0 to 7; step directions) at stepping measurement points in eight directions are measured. In step S1206, for example, when the left neighboring positions of the stepping measurement points are to be measured, positions shifted to the left from the sample shot measurement points in step S1204 by a distance corresponding to a stepping measurement point pitch (e.g., 0.4 mm) are measured. Subsequently, in step S1207, measurement offsets Cik as differences with reference to Ci are calculated from the measurement values obtained on the sample shots in step S1206. This corresponds to calculations of offset components of an intra-chip step due to different measurement positions in FIG. 17. In step S1208, it is checked if measurements of offsets Cik of the stepping measurement points in the eight directions are complete. If YES in step S1208, the offset measurements in all the directions end. The measurement values measured at the stepping measurement points are corrected using the offsets Cik obtained in the above steps and the correction value of the error component produced by the main body deformation, and correction driving is made. In this way, correction driving can be done in the same manner as the measurement and correction at the exposure position.

Figure 11:
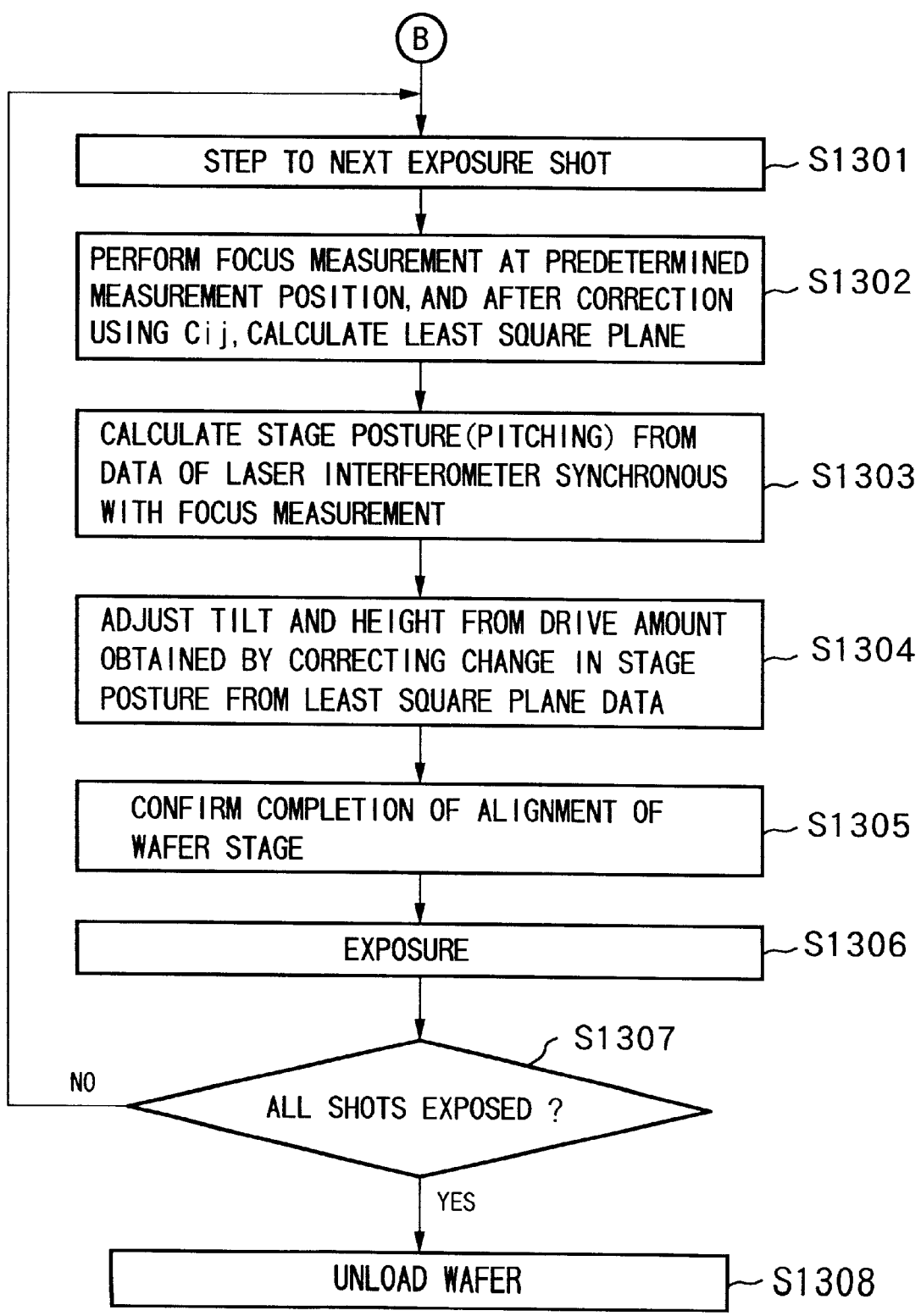
FIG. 11 is a flow chart showing another example of focusing using a measurement value at each shot stepping measurement point by the apparatus shown in FIG. 8.

The method of performing tilt & height correction driving for each shot using the offsets described above with the aid of FIG. 10 will be explained below with reference to FIG. 11. In step S1301, stepping to the shot to be exposed starts. In step S1302, when stepping measurement points corresponding to the same step position where the offsets Cik were measured have been reached, a focus measurement is done, and measurement values are corrected using the offset Cik selected in correspondence with the step direction. In the offset correction method, if fi (i=0 to 5) represents the stepping measurement value of each measurement sensor, and Fi (i=0 to 4) represents the corrected measurement value, Fi is given by:

$$Fi = fi - Cik \quad (2)$$

(for $i = 0$ to 4, $k$: selected from 0 to 7 in correspondence with the step direction).

The least square plane is calculated using the corrected data, and the tilt and height amounts with respect to the image plane of an exposure area are calculated as x and y (ppm), and z (nm). Since the calculated tilt and height amounts still include a deformation component of the main body structure in the pitching direction, stage posture (pitching) data at the focus measurement timing in step S1302 is picked up to calculate the deformation amount included upon focus measurement with respect to the still state (horizontal state) upon exposure in step S1303. That is, pitching amounts α and β in the x- and y-directions are calculated from the difference data between the detection values of the laser beams irradiated onto a mirror (not shown) in the y-direction, and the spans of the two laser beams on the mirror. In step S1304, a true wafer deformation component, i.e., a correction drive amount to be adjusted is calculated from the chip tilt predicted value at the exposure position measured by the focus detection system in step S1302 by correcting the error component that is produced by a relative change in posture of the stage and obtained in step S1303 by the calculations given below, and then, correction driving can be done. That is if (a, b) represents the measurement position of the chip of interest, a change γ in height of the chip position due to the pitching components (α, β: infinitesimal angles) is given by:

$$\gamma = (a \times \alpha) + (b \times \beta) \qquad (3)$$

and a final correction drive amount (X, Y, Z) is:

$$X = x - \alpha \qquad (4)$$

$$Y = y - \beta \qquad (5)$$

$$Z = z - \gamma. \qquad (6)$$

After it is confirmed in step S1305 that alignment in all the six axes is complete, the shot of interest is exposed in step S1306. It is then checked in step S1307 if all the shots have been processed. The sequence in steps S1301 to S1307 repeats itself until exposure of all the shots is completed. If it is determined that exposure of all the shots is complete, the wafer is unloaded in step S1308.

The third embodiment adopts the method of directly measuring the deformation component of the main body structure by a laser interferometer, and correcting the stepping measurement values. Alternatively, when pitching measurement values are directly used in posture control of the stage in real time to minimize the pitching residual amount detected upon focus measurement during stepping, correction errors can be further reduced. In this embodiment, a laser interferometer is used in pitching measurement. Alternatively, a gap sensor such as an electrostatic sensor may be attached to the bottom surface of the stage platen to measure pitching variations of the stage itself.

Fourth Embodiment

As another method of measuring and managing focus offsets of the stepping measurement points separately as an influence component of the intra-chip step and a deformation component of the main body structure, a method of managing the deformation component of the main body structure using a table will be explained below. In the method of dynamically measuring the deformation component of the main body structure by a laser interferometer, the error amount can be reduced in absolute value by real-time correction. However, since two sets of interferometer equipments are required for pitching measurement, and apparatus cost rises, the above-mentioned arrangement is not preferable in terms of COO (cost of ownership). In this embodiment, it has been experimentally concluded that the absolute amount of tilt data at the stepping measurement points upon focus measurement using a bare-Si wafer depends on the mode inherent to the apparatus, and its reproducibility is high enough to execute offset processing. By utilizing this fact, offsets of picture deformation components are measured during stepping throughout all the shots using the bare-Si wafer, and are statistically processed in units of step directions to calculate most probable values. These values are held in the same manner as in management of influence components of intra-chip steps owing to different measurement positions in units of step directions, thus obtaining the same effect as in an independent measurement using a laser interferometer and the like. In the correction sequence in this case, data measured in step S1303 in FIG. 11 are obtained from an offset table of tilt components of the stage measured using a bare-Si wafer and managed in units of step directions in this embodiment.

The method of conforming completion of alignment of the wafer stage and measuring the final correction state in the tilt and height directions from the focus detection system described in the second embodiment maybe applied to the third and fourth embodiments to obtain the same effects as above.

Fifth Embodiment

The fifth embodiment of the present invention will be described below. In this embodiment, in place of measuring the second focus offsets of the first embodiment in the apparatus shown in FIG. 1, stepping pre-scan measurements (stepping measurements) are made for the first wafer during stepping, a measurement at the exposure position is made upon completion of stepping, and the second focus offsets are detected based on these measurement values.

Two sets of measurement points, i.e., exposure point measurement points and stepping pre-scan measurement points in this embodiment will be described in turn below.

FIG. 2 shows the exposure position measurement points. A measurement point 71 is located at nearly the central portion of the area 100 to be exposed, and intersects the optical axis AX at the exposure position. The remaining measurement points 72 to 75 are located on the peripheral portions of the area 100 to be exposed.

FIG. 3 shows stepping pre-scan measurement points. The measurement points 71 to 75 indicated by the broken circles represent the exposure position measurement points, and the arrow indicates the moving direction of the optical axis AX with respect to the wafer. Measurement points indicated by the solid circles are stepping pre-scan measurement points, and are located at positions shifted from the exposure position measurement points in a direction opposite to the moving direction of the optical axis AX.

The shift amount is set to be large enough to complete tilt correction of an optimal focus setting plane and lens image plane during stage stepping after stepping pre-scan measurement. In this embodiment, the shift amount is set at 0.4 mm.

Figure 12:
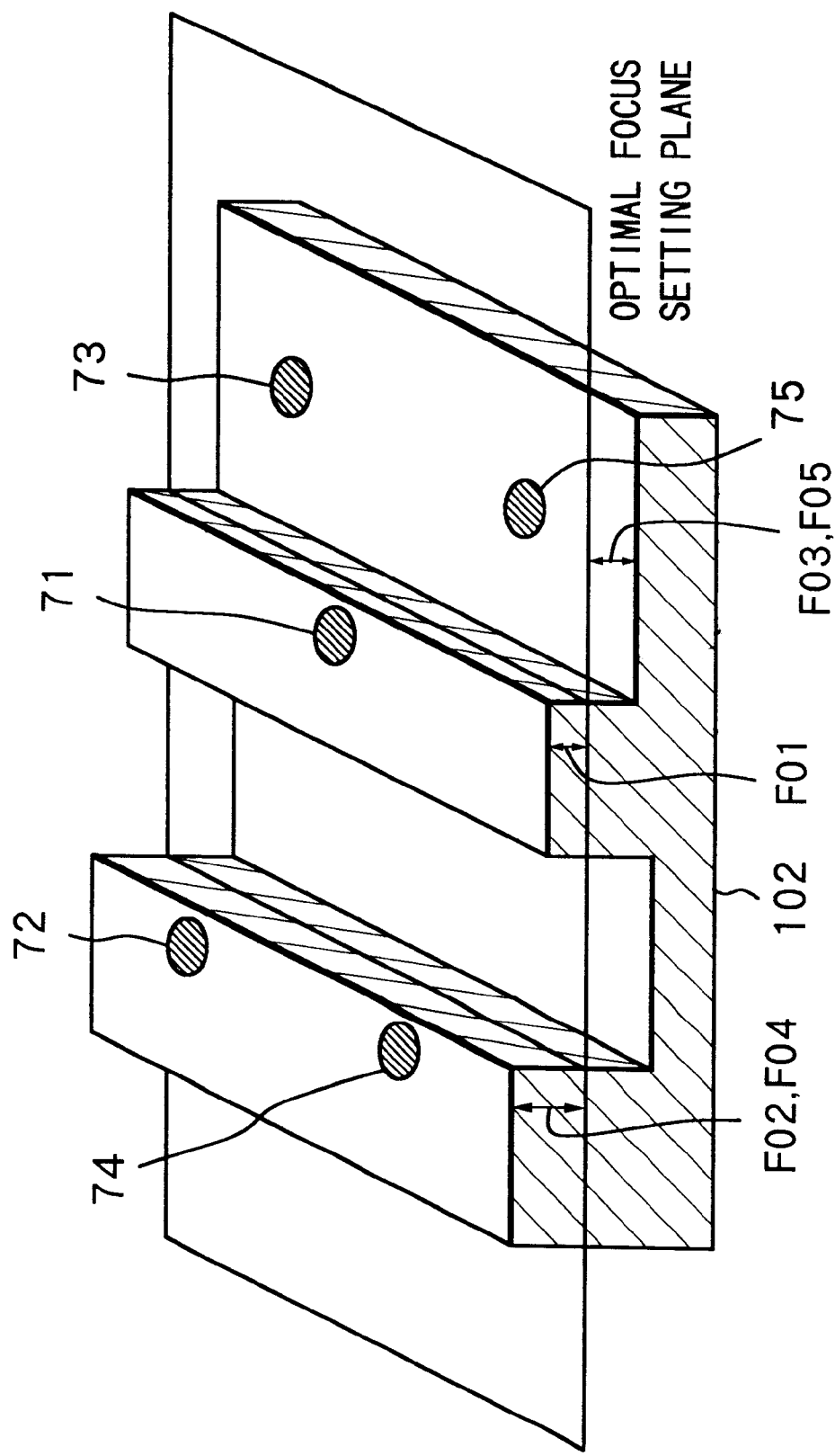
FIG. 12 is a perspective view showing the relationship among the shot to be exposed, optimal focus setting plane, and measurement offsets of exposure position measurement points.

FIG. 12 shows measurement offsets (first focus offsets) F01 to F05 of the exposure position measurement points. In FIG. 12, reference numeral 102 denotes an area to be exposed with a pattern; and 71 to 75, exposure position measurement points. An optimal focus setting plane is set so that all the patterns fall within the depth of focus of the lens.

Figure 13:
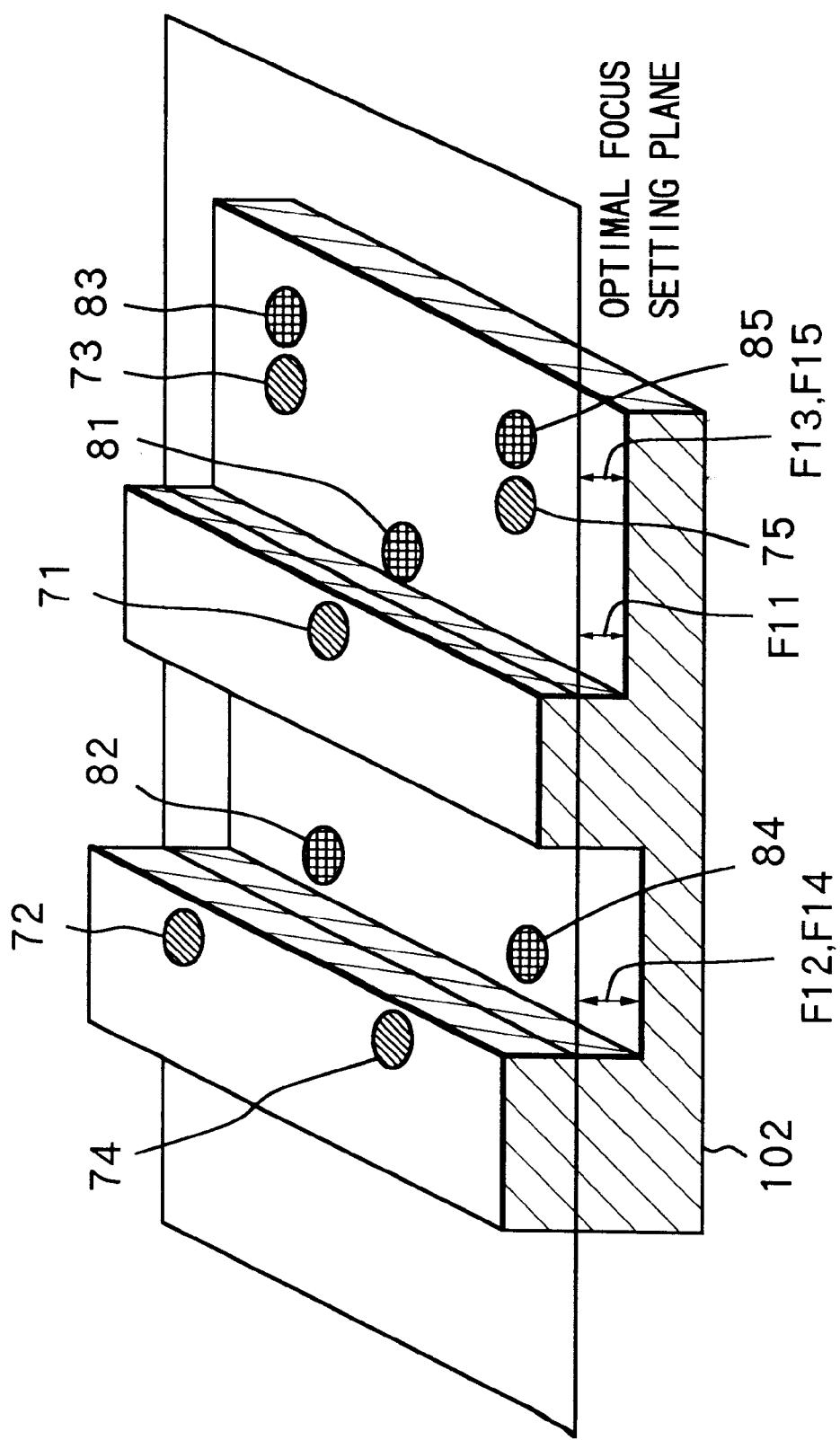
FIG. 13 is a perspective view showing the relationship among the shot to be exposed, optimal focus setting plane, and measurement offsets of stepping measurement points.

FIG. 13 shows measurement offsets (second focus offsets) F11 to F15 of the stepping pre-scan measurement points. In FIG. 13, reference numeral 102 denotes an area that is to be exposed and has a pattern formed thereof; 71 to 75, exposure position measurement points; and 81 to 85, stepping pre-scan measurement points. An optimal focus setting plane is set based on the measurement values at the exposure position measurement points and offsets F01 to F05.

Figure 4:
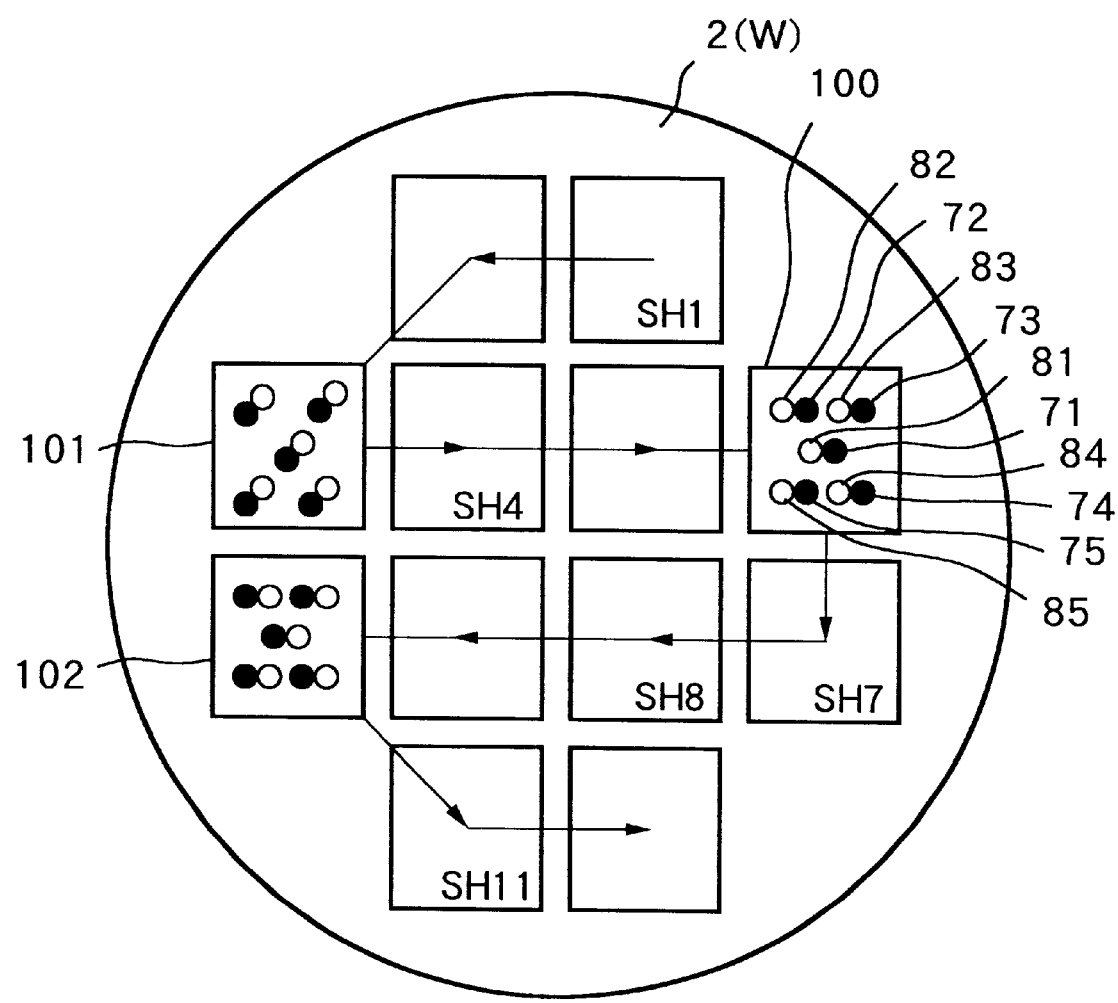
FIG. 4 is an explanatory view showing the correspondence between the exposure position and measurement points laid out on a wafer, and stepping among shots.

FIG. 4 shows the method of obtaining the measurement offsets F11 to F15 of the stepping pre-scan measurement points. In FIG. 4, reference numerals 71 to 75 denote exposure position measurement points; and 81 to 85, stepping pre-scan measurement points. The arrows indicate the path of the optical path on the wafer upon repeating step & repeat (not shown within shots 100 to 102), and the measurement offsets F01 to F05 of the exposure position measurement points are obtained in advance.

Surface positions Z11 to Z15 are measured at the measurement points 81 to 85 while stepping the stage. Stepping of the stage is stopped at the measurement point to obtain surface positions Z01 to Z05. The surface positions Z01 to Z05 are corrected by the measurement offsets F01 to F05 to calculate a least square plane, thus obtaining an optimal focus setting plane. From the distances between the optimal focus setting plane and the surface positions Z11 to Z15, the measurement offsets F11 to F15 of the stepping pre-scan measurement points are obtained.

A method of detecting an optimal focus setting plane of the second wafer 2 and subsequent wafers in this embodiment will be explained below with reference to FIGS. 1 and 4.

The wafer stage 3 is stepped to a target position, so that pinhole images of the mask 6 are projected onto the measurement points of the shot 100 to be exposed. The detection means (4 to 11) in FIG. 1 is set up to detect the surface positions of the five measurement points 81 to 85 within the first shot. The surface position detector 14 forms surface position data Z11 to Z15 of the respective measurement points on the basis of the output signals from the position detection element 11, and sends them to the controller 13. The controller 13 adds these five surface position data Z11 to Z15 to the measurement offsets F11 to F15 and calculates a least square plane, thus obtaining an optimal focus setting plane.

Note that the least square plane z satisfies:

$$\sum_{i=1}^{5} |z - (Zli + Fli)|^2 = 0 \qquad (7)$$

The controller 13 inputs a command signal corresponding to the calculation result to the stage driver 12 to control it to adjust (correct) the position and tilt of the wafer 2 on the wafer stage 3 in the direction of the optical axis AX. With this control, the optimal focus setting plane of the area 100 to be exposed is aligned to the best imaging plane (focal plane) of the reduction projection lens system 1. Upon completion of adjustment of this surface position, a circuit pattern image is transferred onto the first area 100 by exposure.

The flow of the processing of this embodiment will be described below with reference to the flow charts.

Figure 14:
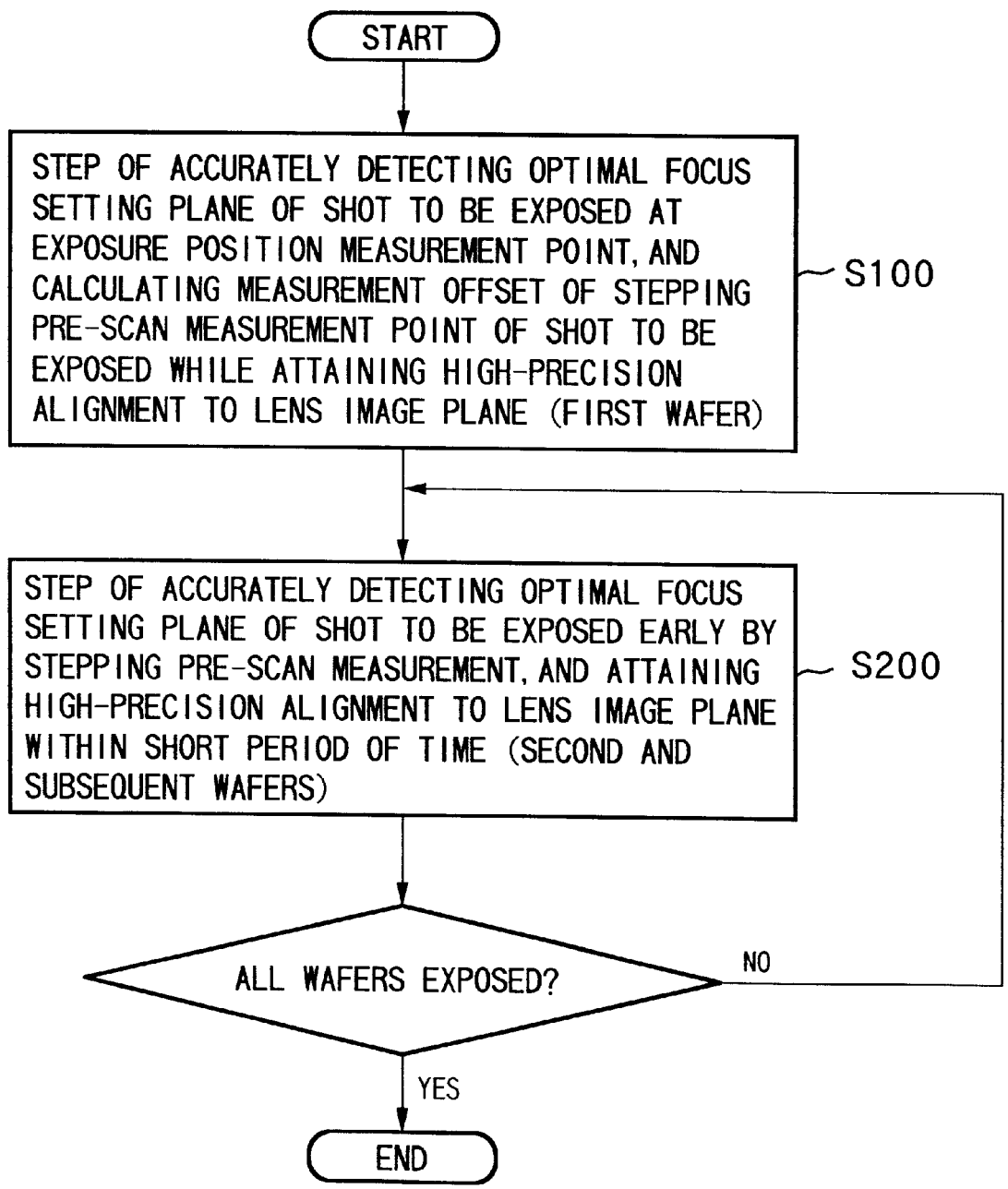
FIG. 14 is a flow chart showing an example of surface position adjustment using a surface position detection method according to the fifth embodiment of the present invention.

The overall flow will be explained first with the aid of FIG. 14. In a wafer lot process, using the first wafer, an optimal focal plane and the lens image plane are aligned to each other at the exposure position measurement points (71 to 75), and at the same time, measurement offsets (F11 to F15) of the stepping pre-scan measurement points (81 to 85) are measured in step S100. In step S200, an optimal focus setting plate is accurately detected by correcting the stepping pre-scan measurement points (81 to 85) using the measurement offsets (F11 to F15) obtained in step S100, and high-speed alignment is done (the second and subsequent wafers).

Figure 15:
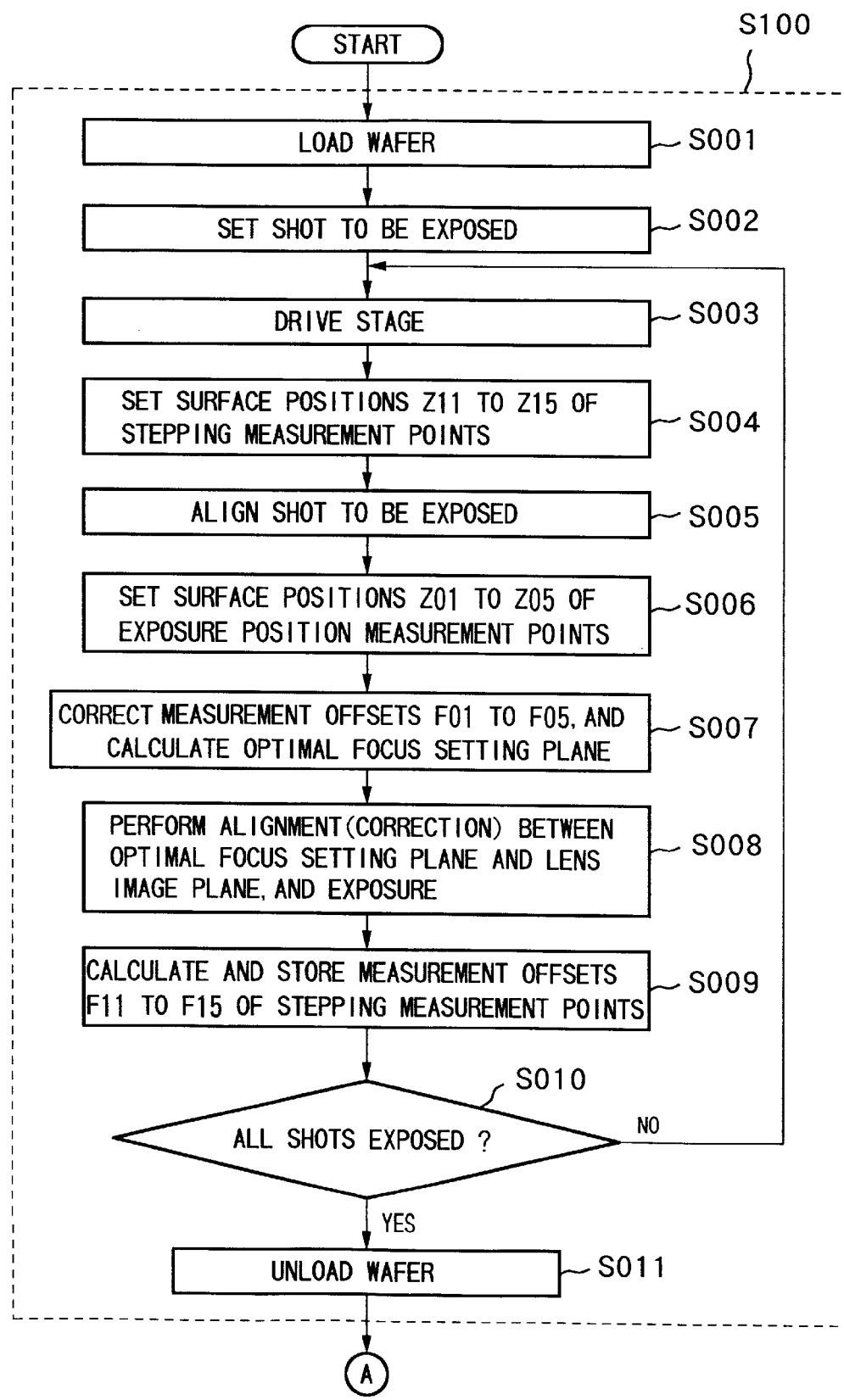
FIG. 15 is a flow chart showing the operation related to the first wafer in the flow chart in FIG. 14.

The flow in step S100 will be explained in detail below with reference to FIG. 15.

In step S001, the first wafer is loaded from a wafer carrier onto the wafer stage 3 and is fixed on a wafer chuck.

In step S002, the shot to be exposed is set in the controller 13.

In step S003, driving of the wafer stage 3 is started, so that the center of the shot to be exposed reaches that of the optical axis AX of the lens 1.

When the center of the shot to be exposed has reached a position a predetermined distance (e.g., 0.4 mm) from the center of the optical axis AX of the lens 1, surface positions (Z11 to Z15) are detected using the measurement points (81 to 85) in step S004.

In step S005, the center of the shot to be exposed is aligned to the optical axis AX parallel to stage driving.

In step S006, surface positions (ZO1 to Z05) are detected using the measurement points (71 to 75).

In step S007, the surface positions (Z01 to Z05) are corrected by the measurement offsets (F01 to F05), anda least square plane is calculated, thus obtaining an optimal focus setting plane.

In step S008, the stage 3 is driven so that the optimal focus setting plane matches the lens image plane, and exposure is done.

In step S009, the measurement offsets (F11 to F15) of the stepping pre-scan measurement points are obtained from the distances between the optimal focus setting plane and the measurement points (81 to 85), and are stored in the controller 13 together with the shot No. of the shot to be exposed.

If it is determined in step S010 that exposure of all the shots is not complete, the flow returns to step S002 to repeat steps S002 to S009.

In step S011, the wafer is unloaded from the wafer stage 3 and is stored in the wafer carrier.

Figure 16:
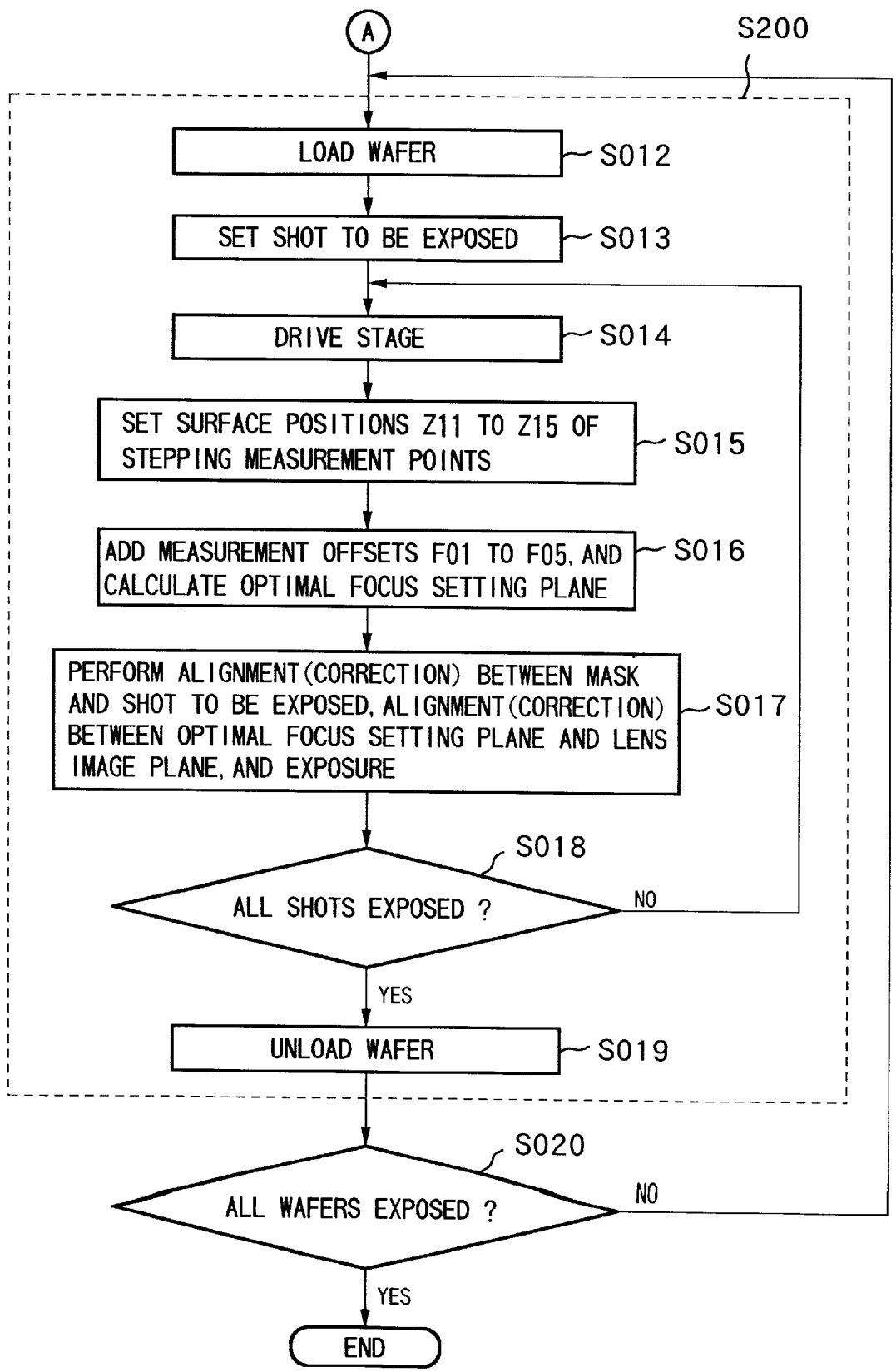
FIG. 16 is a flow chart showing the operation related to the second wafer in the flow chart in FIG. 14.

The flow in step S200 will be explained in detail below with reference to FIG. 16.

In step S012, a wafer is loaded from the wafer carrier onto the wafer stage 3 and is fixed on the wafer chuck.

In step S013, the shot to be exposed is set in the controller 13.

In step S014, driving of the wafer stage 3 is started, so that the center of the shot to be exposed reaches that of the optical axis AX of the lens 1.

When the center of the shot to be exposed has reached a position a predetermined distance (e.g., 0.4 mm) from the center of the optical axis Ax of the lens 1, surface positions (Z11 to Z15) are detected using the measurement points (81 to 85) in step S015.

In step S016, the measurement offsets (F11 to F15) stored together with the shot No. of the shot to be exposed are read out from the controller 13 to correct the surface positions (Z11 to Z15), and a least square plane is calculated, thus obtaining an optimal focus setting plate.

In step S017, after stage driving, alignment between the mask and the shot to be exposed, and that between the optimal focus setting plane and lens image plane are simultaneously done, and exposure is made after completing the alignment.

If it is determined in step S018 that exposure of all the shots is not complete, the flow returns to step S013 to repeat steps S013 to S017.

In step S019, the wafer is unloaded from the wafer stage 3 and is stored in the wafer carrier.

If it is determined in step S020 that exposure of all the wafers is not complete, the flow returns to step S012 to repeat steps S012 to S019.

According to this embodiment, even when the stepping pre-scan measurement is performed, the optimal focus setting plane and lens image plane can be aligned with high precision.

Sixth Embodiment

The sixth embodiment will be described below with reference to FIG. 4. In this embodiment, in addition to the processing in the fifth embodiment, detection errors B11 to B15 of the optimal focus setting plane in the stepping pre-scan measurement are measured during exposure of the shot to be exposed, and the measurement offsets F11 to F15 of the shot to be exposed are updated using these errors, so as to detect the optimal focus setting plane of the shot to be exposed of the next wafer. In this embodiment, during exposure after the shot 102 to be exposed is corrected using data at the stepping pre-scan measurement points 81 to 85, an optimal focus setting plane is detected at the exposure position measurement points 71 to 75, focus correction errors B11 to B15 of the shot to be exposed are measured from a deviation between the optimal focus setting plane and lens image plane, and the obtained errors are stored in the controller 13.

Measurement offsets F11(n+1) to F15(n+1) of the shot to be exposed of the (n+1)-th wafer are calculated from focus correction errors B11(n) to B15(n) of that shot of the n-th wafer by:

$$F11(n+1) = F11(n) + B11(n) = F11(2) + \sum_{i=2}^{n} B11(i) \qquad (8)$$

(The same applies to F12 to F15.)

The calculated measurement offsets F11(n+1) to F15(n+1) are stored in the controller 13 together with the shot No., and is used in detection of the optimal focus setting plane of the corresponding shot to be exposed of the (n+1)-th wafer.

According to this embodiment, even when random disturbances (a warp of the wafer, stage vibrations) have taken place, the optimal focus setting plane can be accurately detected, and can be aligned to the lens image plane with high precision.

Seventh Embodiment

The seventh embodiment will be explained below with reference to FIG. 4. In this embodiment, an optimal focus setting plane is detected again during exposure of the shot to be exposed, and the focus is re-set, in addition to the fifth embodiment.

In this embodiment as well, as has been described in the fifth embodiment, exposure starts after completion of alignment between the optimal focus setting plane detected at the stepping pre-scan measurement points (81 to 85) during stage stepping to the shot to be exposed, and alignment of the stage on the second and subsequent wafers. In addition, in this embodiment, the optimal focus setting plane is re-detected at the exposure position measurement points (71 to 75) to align (re-correct) the optimal focus setting plane and lens image plane.

According to this embodiment, even when the precision of stepping pre-scan measurement temporarily drops due to vibrations during stage stepping, the influences on exposure can be minimized.

Modifications of Embodiments

In the aforementioned embodiments, a two-dimensional CCD is used as the focus detection sensor. However, the present invention is not limited to such a specific device. For example, a plurality of linear CCD sensors may be used to cope with multi-point measurements. Also, when analog sensors such as photodiodes, PSDs, and the like are used, offsets are managed in units of shots as in the above embodiments, thus obtaining the same effect. Furthermore, in the method of achieving synchronization of the stage position, a hardware timing transmission line may be independently arranged to make timing management. When a communication command is used, such synchronization may be implemented using an interrupt that can transmit the timing within the shortest period of time. As a method of achieving timing synchronization and resetting the start timing of the measurement sensor, in a case of an accumulation sensor such as a CCD, a logic operation may be formed to reset the reset timing simultaneously with a sync command. On the other hand, in the case of an analog sensor such as a photodiode or the like, the timing of an A/D converter may be managed in synchronism with a sync command.

Embodiment of Device Manufacturing Method

Figure 19:
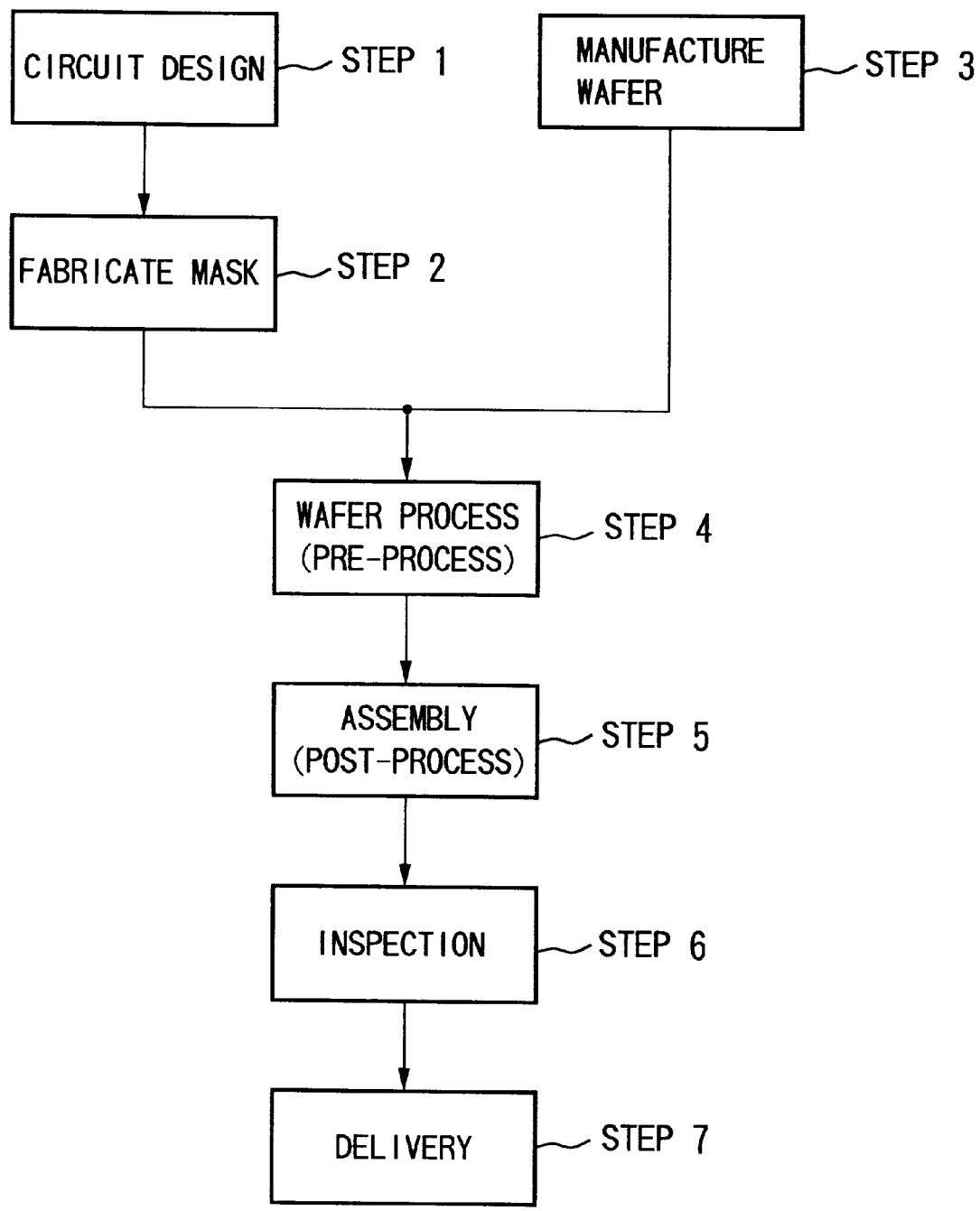
FIG. 19 is a flow chart showing the manufacturing flow of microdevices.

An embodiment of the method of manufacturing a device using the aforementioned exposure apparatus or method will be explained below. FIG. 19 shows the flow in the manufacture of a microdevice (semiconductor chips such as ICs, LSIs, and the like, liquid crystal panels, thin film magnetic heads, micromachines, and the like). In step 1 (circuit design), the circuit design of a semiconductor device is made. In step 2 (manufacture mask), a mask formed with a designed circuit pattern is manufactured. In step 3 (fabricate wafer), a wafer is fabricated using materials such as silicon and the like. Step 4 (wafer process) is called a pre-process, and an actual circuit is formed by lithography using the prepared mask and wafer. The next step 5 (assembly) is called a post-process, in which semiconductor chips are assembled using the wafer obtained in step 4, and includes an assembly process (dicing, bonding), a packaging process (encapsulating chips), and the like. In step 6 (inspection), inspections such as operation confirmation tests, durability tests, and the like of semiconductor devices assembled in step 5 are run. Semiconductor devices are completed via these processes, and are delivered (step 7).

Figure 20:
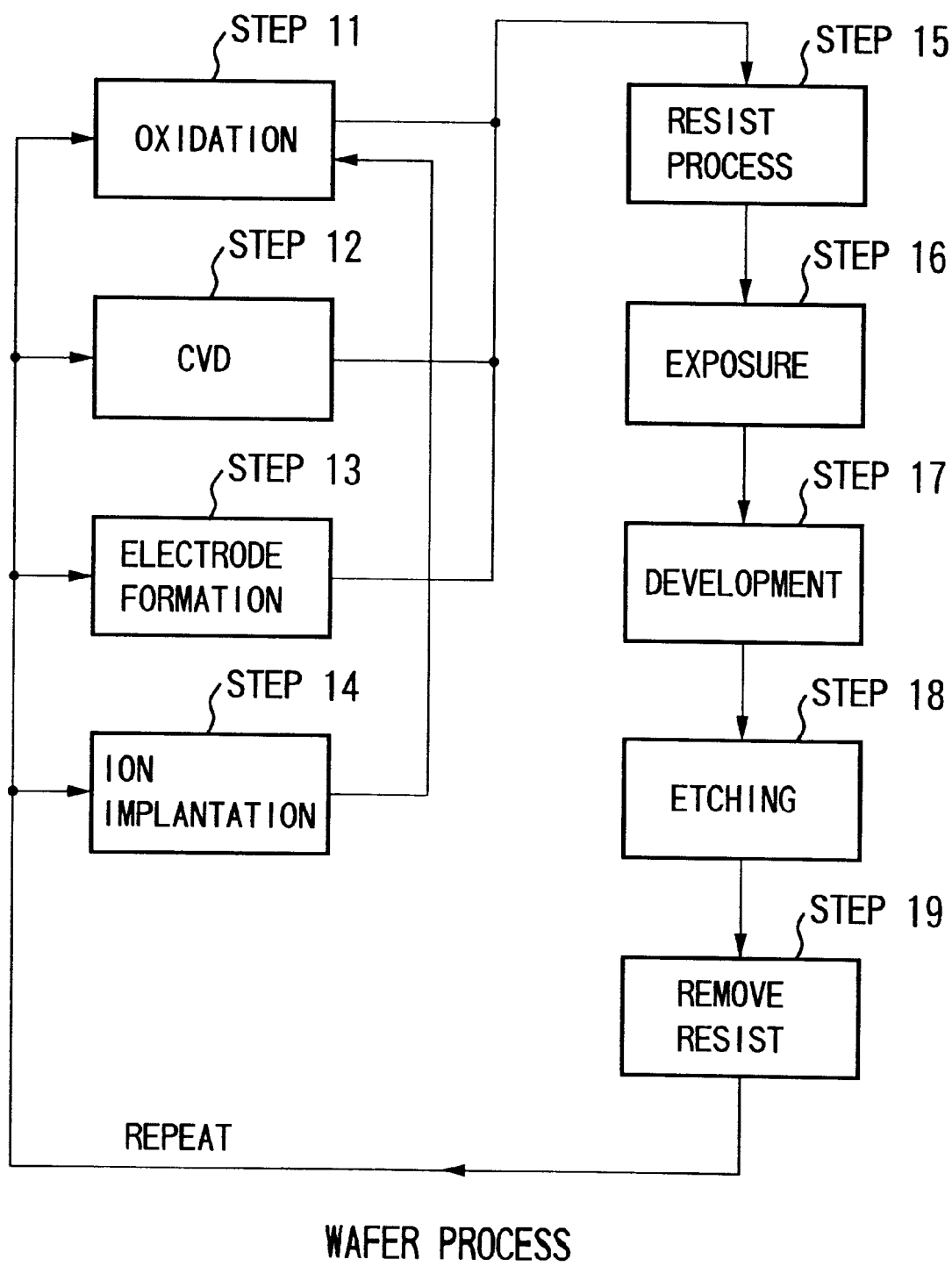
FIG. 20 is a flow chart showing the flow of the wafer process in FIG. 19 in detail.

FIG. 20 shows the detailed flow of the wafer process. In step 11 (oxidation), the surface of the wafer is oxidized. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the electron beam exposure apparatus. In step 17 (development), the exposed wafer is developed. In step 18 (etching), a portion other than the developed resist image is removed by etching. In step 19 (remove resist), the resist film which has become unnecessary after etching is removed. By repeating these steps, multiple circuit patterns are formed on the wafer.

Using the manufacturing method of this embodiment, a highly integrated semiconductor device, which is not easy to manufacture by the conventional method, can be manufactured at low cost.

To recapitulate, according to the present invention, the tilt and position in the height directions of the exposure position with respect to the image plane can be accurately calculated using stepping measurement values. In addition, since measurement values during stepping are positively corrected and used, the step time can be greatly shortened as compared to the conventional method. Since the confirmation timing of the focus final correction state can be set without prolonging the step time, processes can be reliably and quickly done upon transfer of micro-patterns in future high-NA exposure apparatuses.

The present invention is not limited to the above embodiments and various changes and modifications can be made within the spirit and scope of the present invention.

Therefore, to apprise the public of the scope of the present invention, the following claims are made.

What is claimed is:

1. An exposure method for exposing a surface to be exposed via a projection optical system after a substrate moves stepwise in a direction perpendicular to an optical axis of the projection optical system to feed to a predetermined exposure position a plurality of shots on the substrates, in turn, in which at least one of a position and tilt of the surface to be exposed of a fed shot to be exposed in the direction of the optical axis is measured during the stepwise movement, and the surface to be exposed is brought to a position of a focal plane of the projection optical system on the basis of a measurement value, said method comprising:

a step of obtaining, in advance, a focus offset as a measurement error resulting from different measurement points for the measurement during the stepwise movement and a deformation of a main body structure, in each shot; and a step of bringing the surface to be exposed for the shot to be exposed to the position of the focal plane on the basis of a correction result of the measurement, in each shot to be exposed, using the focus offset, in an exposure sequence.

2. The method according to claim 1, wherein the focus offset is obtained on the basis of a measurement error resulting from an intra-chip step produced when a position of the surface to be exposed is measured at the exposure position.

3. The method according to claim 1, wherein start timings of the measurements in each shot to be exposed in the exposure sequence are synchronized with reference to a position of the shot to be exposed during the stepwise movement.

4. The method according to claim 1, further comprising:

a step of confirming a position of the surface to be exposed, which has already been set in focus, at a predetermined timing after the surface to be exposed is brought to the position of the focal plane of the projection optical system using the correction result, and before an exposure start; and a step of determining whether or not correction driving is to be redone based on the confirmation result by discriminating a residual using a given threshold value.

5. An exposure method for exposing a surface to be exposed via a projection optical system after a substrate moves stepwise in a direction perpendicular to an optical axis of the projection optical system to feed to a predetermined exposure position a plurality of shots on the substrates, in turn, in which at least one of a position and tilt of the surface to be exposed of a fed shot to be exposed in the direction of the optical axis is measured during the stepwise movement, and the surface to be exposed is brought to a position of a focal plane of the projection optical system on the basis of a measurement value, said method comprising:

a step of obtaining, in advance, a focus offset as a measurement error resulting from different measurement points for the measurement during the stepwise movement; and a step of bringing the surface to be exposed for the shot to be exposed to the position of the focal plane on the basis of a correction result of the measurement, in each shot to be exposed, using the focus offset and information regarding a relative positional relationship between the focal plane and the surface to be exposed upon deformation of a main body structure in the measurement in an exposure sequence.

6. The method according to claim 5, wherein the focus offset is obtained on the basis of a measurement error resulting from an intra-chip step produced when a position of the surface to be exposed is measured at the exposure position.

7. The method according to claim 5, further comprising obtaining the information regarding the relative positional relationship between the focal plane and the surface to be exposed upon deformation of the main body structure by measuring a pitching component of a posture of a stage.

8. The method according to claim 5, further comprising obtaining the information regarding the relative positional relationship between the focal plane and the surface to be exposed upon deformation of the main body structure by measuring a pitching amount in a direction of the stepwise movement direction, in advance.

9. The method according to claim 5, further comprising synchronizing start timings of the stepping measurements in each shot to be exposed in the exposure sequence with reference to a position of the shot to be exposed during the stepwise movement.

10. The method according to claim 5, further comprising:

a step of confirming a position of the surface to be exposed, which has already been set in focus, at a predetermined timing after the surface to be exposed is brought to the position of the focal plane of the projection optical system using the correction, and before an exposure start; and a step of determining whether or not correction driving is to be redone based on the confirmation result by discriminating a residual using a given threshold value.

11. An exposure method for exposing a surface to be exposed via a projection optical system after a substrate moves stepwise in a direction perpendicular to an optical axis of the projection optical system to feed to a predetermined exposure position a plurality of shots on the substrate, in turn, in which at least one of a position and tilt of the surface to be exposed of a fed shot to be exposed in the direction of the optical axis is measured during the stepwise movement, and the surface to be exposed is brought to a position of a focal plane of the projection optical system on the basis of a measurement value, said method comprising:

a step of performing the measurement during the stepwise movement, in each shot, for a first wafer of a plurality of wafers to be subjected to an identical exposure process, and performing a position measurement of the surface to be exposed after the shot to be exposed is fed to the exposure position;

a step of obtaining and storing a focus offset as a measurement error resulting from different measurement points for the measurement during the stepwise movement and a deformation of a main body structure in each shot, using a measurement value obtained by the measurement during the stepwise movement and a measurement value obtained at the exposure position; and a step of bringing the surface to be exposed of the shot to be exposed to the position of the focal plane on the basis of a correction result of the measurement, in each shot to be exposed, using the focus offset, for a second wafer and subsequent wafers.

12. The method according to claim 11, wherein the focus offset is obtained on the basis of a measurement error resulting from an intra-chip step produced when a position of the surface to be exposed is measured at the exposure position.

13. The method according to claim 11, further comprising:
   a step of performing a measurement at the exposure position after the surface to be exposed is brought to the position of the focal plane of the projection optical system, using the correction result at a measurement point using the focus offset for the second wafer and subsequent wafers; and
   a step of re-calculating the focus offset on the basis of the measurement result.

14. The method according to claim 11, further comprising:
   a step of performing a measurement at the exposure position after the surface to be exposed is brought to the position of the focal plane of the projection optical system, using the correction result at a measurement point using the focus offset for the second wafer and subsequent wafers; and
   a step of finely adjusting a position of the surface to be exposed.

15. An exposure apparatus comprising:
   a projection optical system for projecting a pattern formed on a master disk onto a photosensitive substrate;
   a stage which is moved stepwise along a direction perpendicular to an optical axis of said projection optical system while carrying the substrate to feed a plurality of shots on the substrate, in turn, to a predetermined exposure position;
   focus measurement means for measuring at least one of a position and tilt of a surface to be exposed of the substrate in a direction of the optical axis at the exposure position;
   focusing means for bringing the surface to be exposed to a position of a focal plane of said projection optical system;
   means for obtaining, in advance, a focus offset as a measurement error resulting from different measurement points for the measurement during the stepwise movement and a deformation of a main body structure, in each shot; and
   correction means for correcting a measurement value of the measurement using the focus offset in an exposure sequence before the measurement value is supplied to said focusing means.

16. The apparatus according to claim 15, wherein said means for obtaining the focus offset obtains the focus offset on the basis of a measurement error resulting from an intra-chip step produced when a position of the surface to be exposed is measured at the exposure position.

17. The apparatus according to claim 15, wherein measurement start timings upon executing the measurement using said focus measurement means are synchronized with reference to a stage position.

18. The apparatus according to claim 15, further comprising means for confirming a position of the surface to be exposed, which has already been set in focus, at a predetermined timing after the surface to be exposed is brought to the position of the focal plane of said projection optical system using the correction result, and before an exposure start, and for determining whether or not correction driving is to be redone based on the confirmation result, by discriminating a residual using a given threshold value.

19. An exposure apparatus comprising:
   a projection optical system for projecting a pattern formed on a master disk onto a photosensitive substrate;
   a stage which is moved stepwise along a direction perpendicular to an optical axis of said projection optical system while carrying the substrate to feed a plurality of shots on the substrate, in turn to a predetermined exposure position;
   focus measurement means for measuring at least one of a position and tilt of a surface to be exposed of the substrate in a direction of the optical axis at the exposure position;
   focusing means for bringing the surface to be exposed to a position of a focal plane of said projection optical system;
   means for obtaining, in advance, a focus offset as a measurement error resulting from different measurement points for the measurement during the stepwise movement; and
   correction means for correcting a measurement value of the measurement using the focus offset and information regarding a relative positional relationship between the focal plane and the surface to be exposed upon deformation of a main body structure in the measurement, before the measurement value is supplied to said focusing means in an exposure sequence.

20. The apparatus according to claim 19, wherein said means for obtaining the focus offset obtains the focus offset on the basis of a measurement error resulting from an intra-chip step produced when a position of the surface to be exposed is measured at the exposure position.

21. The apparatus according to claim 19, wherein said means for obtaining the information regarding the relative positional relationship between the focal plane and the surface to be exposed upon deformation of the main body structure comprises means for measuring a pitching component of a posture of said stage.

22. The apparatus according to claim 19, further comprising a table that stores pitching amounts in directions of the stepwise movement, which amounts are measured in advance, which is held as the relative positional relationship between the focal plane and the surface to be exposed upon deformation of the main body structure.

23. The apparatus according to claim 19, wherein measurement start timings upon executing the stepping measurement using said focus measurement means are synchronized with reference to a position of said stage.

24. The apparatus according to claim 19, further comprising means for confirming a position of the surface to be exposed, which has already been set in focus, at a predetermined timing after the surface to be exposed is brought to the position of the focal plane of said projection optical system, using the correction result of the measurement, and before an exposure start, and for determining whether or not correction driving is to be redone based on the confirmation result by discriminating a residual using a given threshold value.

25. A device manufacturing method comprising the steps of:
   exposing a surface to be exposed via a projection optical system after a substrate moves stepwise in a direction perpendicular to an optical axis of the projection optical system to feed to a predetermined exposure position a plurality of shots on the substrate, in turn;
   measuring at least one of a position and tilt of the surface to be exposed of a fed shot to be exposed in the direction of the optical axis during the stepwise movement;

obtaining, in advance, a focus offset as a measurement error resulting from different measurement points for the measurement during the stepwise movement and a deformation of a main body structure, in each shot;

bringing the surface to be exposed for the shot to be exposed to the position of the focal plane on the basis of a correction result of the measurement, in each shot to be exposed, using the focus offset, in an exposure sequence; and manufacturing a device.

26. A device manufacturing method comprising the steps of:

exposing a surface to be exposed via a projection optical system after a substrate moves stepwise in a direction perpendicular to an optical axis of the projection optical system to feed to a predetermined exposure position a plurality of shots on the substrate, in turn;

measuring at least one of a position and tilt of the surface to be exposed of a fed shot to be exposed in the direction of the optical axis during the stepwise movement;

obtaining, in advance, a focus offset as a measurement error resulting from different measurement points for the measurement during the stepwise movement;

bringing the surface to be exposed for the shot to be exposed to the position of the focal plane on the basis of a correction result of the measurement, in each shot to be exposed, using the focus offset and information regarding a relative positional relationship between the focal plane and the surface to be exposed upon deformation of a main body structure in the measurement, in an exposure sequence; and manufacturing a device.

27. A device manufacturing method comprising the steps of:

exposing a surface to be exposed via a projection optical system after a substrate moves stepwise in a direction perpendicular to an optical axis of the projection optical system to feed to a predetermined exposure position a plurality of shots on the substrate, in turn;

measuring at least one of a position and tilt of the surface to be exposed of a fed shot to be exposed in the direction of the optical axis during the stepwise movement;

performing the measurement during the stepwise movement, in each shot, for a first wafer of a plurality of wafers to be subjected to an identical exposure process, and performing a position measurement of the surface to be exposed after the shot to be exposed is fed to the exposure position;

obtaining and storing a focus offset as a measurement error resulting from different measurement points for the measurement during the stepwise movement and a deformation of a main body structure in each shot, using a measurement value obtained by the measurement during the stepwise movement and a measurement value obtained at the exposure position;

bringing the surface to be exposed of the shot to be exposed to the position of the focal plane on the basis of a correction result of the measurement, in each shot to be exposed, using the focus offset, for a second wafer and subsequent wafers; and manufacturing a device.

28. An exposure method, in which at least one of a position and tilt of a surface to be exposed is measured while a substrate moves stepwise to a predetermined exposure position, said method comprising:

a step of obtaining a focus offset as a measurement error resulting from different measurement points for the measurement during the stepwise movement and a deformation of a main body structure; and a step of bringing the surface to be exposed to a position of a focal plane on the basis of a correction result determined by using (i) the at least one of the position and tilt of the surface to be exposed and (ii) the focus offset.

* * * * *

UNITED STATES PATENT AND TRADEMARK OFFICE
CERTIFICATE OF CORRECTION

PATENT NO. : 6,236,447 B1  
DATED : May 22, 2001  
INVENTOR(S) : Yuichi Yamada et al.

Page 1 of 1

It is certified that error appears in the above-identified patent and that said Letters Patent is hereby corrected as shown below:

Column 4,
Line 53, "given-threshold" should read -- given threshold --.

Column 13,
Line 10, "correction– exposure" should read -- correction exposure --.

Column 15,
Line 24, "rand" should read -- r and --.

Column 17,
Line 5, "is if" should read -- is, if --.

Column 20,
Line 3, "ZO1 to Z05" should read -- Z01 to Z05 --;
Line 6, "anda" should read -- and a --.

Column 24,
Lie 3, "measurement" should read -- measurement, --.

Column 26,
Line 7, "in turn" should read -- in turn, --.

Signed and Sealed this

Fifteenth Day of January, 2002

Attest:

JAMES E. ROGAN  
*Director of the United States Patent and Trademark Office*

*Attesting Officer*